(12) United States Patent
Lee

(10) Patent No.: US 11,016,004 B2
(45) Date of Patent: May 25, 2021

(54) VEHICULAR SIMULATION

(71) Applicant: AT&T Intellectual Property I, L.P., Atlanta, GA (US)

(72) Inventor: Craig Lee, Frisco, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 490 days.

(21) Appl. No.: 15/191,610

(22) Filed: Jun. 24, 2016

(65) Prior Publication Data

US 2016/0305849 A1    Oct. 20, 2016

Related U.S. Application Data

(63) Continuation of application No. 14/083,697, filed on Nov. 19, 2013, now Pat. No. 9,401,056.

(51) Int. Cl.
| | | |
|---|---|---|
| *G01M 17/007* | (2006.01) | |
| *G06F 30/20* | (2020.01) | |
| *G07C 5/08* | (2006.01) | |
| *H04L 29/08* | (2006.01) | |

(52) U.S. Cl.
CPC .......... *G01M 17/007* (2013.01); *G06F 30/20* (2020.01); *G07C 5/0825* (2013.01); *H04L 67/12* (2013.01)

(58) Field of Classification Search
None
See application file for complete search history.

(56) References Cited

U.S. PATENT DOCUMENTS

| | | | |
|---|---|---|---|
| 5,261,824 A | 11/1993 | Ness | |
| 5,949,330 A | 9/1999 | Hoffman | |
| 6,832,141 B2 | 12/2004 | Skeen et al. | |
| 7,683,771 B1 | 3/2010 | Loeb | |
| 7,774,130 B2 | 8/2010 | Pepper | |
| 8,099,217 B2 | 1/2012 | Greiner et al. | |
| 8,478,237 B1* | 7/2013 | Stenta | H04M 1/67 455/410 |
| 8,489,272 B2 | 7/2013 | Sano et al. | |
| 8,565,948 B2 | 10/2013 | Pudar | |
| 8,920,173 B1 | 12/2014 | Fitzgerald | |
| 2005/0216151 A1* | 9/2005 | Gawlik | G07C 5/008 701/31.4 |
| 2009/0271066 A1 | 10/2009 | Underdal et al. | |
| 2010/0127847 A1 | 5/2010 | Evans | |

(Continued)

FOREIGN PATENT DOCUMENTS

| | | |
|---|---|---|
| JP | 2006170952 | 6/2006 |
| WO | 2009138131 A1 | 11/2009 |

OTHER PUBLICATIONS

BMW Evolve Mobile App, https://www.youtube.com/watch?v=FxLWEagftsA (Year: 2011).*

(Continued)

*Primary Examiner* — Thomas G Black
*Assistant Examiner* — Ana D Thomas
(74) *Attorney, Agent, or Firm* — Amin, Turocy & Watson, LLP

(57) ABSTRACT

Vehicle profiles allow drivers of vehicles to select any vehicle they desire to simulate. A graphical dashboard may be reconfigured to assume a graphical interface of any vehicle. A prospective buyer of an electric vehicle may configure the dashboard of a conventional, internal combustion vehicle to visually simulate an electric vehicle.

20 Claims, 31 Drawing Sheets

(56) References Cited

U.S. PATENT DOCUMENTS

| | | | |
|---|---|---|---|
| 2010/0131304 A1* | 5/2010 | Collopy | G06Q 30/0269 705/4 |
| 2010/0164698 A1 | 7/2010 | Tsubooka | |
| 2010/0305814 A1 | 12/2010 | Ichikawa | |
| 2011/0054768 A1 | 3/2011 | Sullivan | |
| 2011/0144839 A1 | 6/2011 | Pudar | |
| 2011/0205043 A1 | 8/2011 | Fujiki | |
| 2011/0205044 A1 | 8/2011 | Enomoto | |
| 2011/0224868 A1 | 9/2011 | Collings, III et al. | |
| 2011/0241864 A1 | 10/2011 | Fujiki | |
| 2011/0270486 A1* | 11/2011 | Stevens | G07C 5/0816 701/31.4 |
| 2012/0303198 A1 | 11/2012 | Wada | |
| 2013/0090790 A1 | 4/2013 | Yuen et al. | |
| 2013/0151065 A1 | 6/2013 | Ricci | |
| 2014/0129080 A1* | 5/2014 | Leibowitz | G06Q 30/0631 701/33.3 |

OTHER PUBLICATIONS

Boeriu, Horatiu. (Apr. 18, 2011). "BMW 'Evolve' App" [BMW blog post]. Retrieved from https://www.bmwblog.com/2011/04/18/bmw-evolve-app/ (Year: 2011).*

Wikipedia contributors. (Jan. 10, 2019). "Computer". In Wikipedia, The Free Encyclopedia. Retrieved Jan. 10, 2019, from https://en.wikipedia.org/w/index.php?title=Computer&oldid=878729003 (Year: 2019).*

"BMW EVolve Mobile App", Published on Apr. 15, 2011 by user "BMW USA". <https://www.youtube.com/watch?v=FxLWEagftsA>. (Year: 2011).*

"Are You Electric Car Ready? BMW's New App Helps You Decide", Published on Apr. 22, 2011 by Green Car Reports. Retrieved from the Internet: https:/www.greencarreports.com/news/1058854_are-you-electric-car-ready-bmws-new-app-helps-you-decide (Year: 2011).*

Speidel, Stuart, et al. "Analysis of Western Australian electric vehicle and charging station trials." Australasian Transport Research Forum (ATRF), 35th, 2012, Perth, Western Australia, Australia. 2012.

Non-Final Office Action received for U.S. Appl. No. 14/083,697 dated Apr. 8, 2015, 18 pages.

Final Office Action received for U.S. Appl. No. 14/083,697 dated Oct. 27, 2015, 22 pages.

Notice of Allowance received for U.S. Appl. No. 14/083,697 dated Mar. 25, 2016, 15 pages.

* cited by examiner

VEHICULAR SIMULATION

CROSS-REFERENCE TO RELATED
APPLICATION

This application is a continuation of U.S. application Ser. No. 14/083,697 filed Nov. 19, 2013 and since issued as U.S. Pat. No. 9,401,056, which is incorporated herein by reference in its entirety.

BACKGROUND

Car buying is loathsome to many people. Purchase prices are high, financing is confusing, and the overall experience is intimidating.

BRIEF DESCRIPTION OF THE SEVERAL
VIEWS OF THE DRAWINGS

The features, aspects, and advantages of the exemplary embodiments are understood when the following Detailed Description is read with reference to the accompanying drawings, wherein.

DETAILED DESCRIPTION

Figure 1:
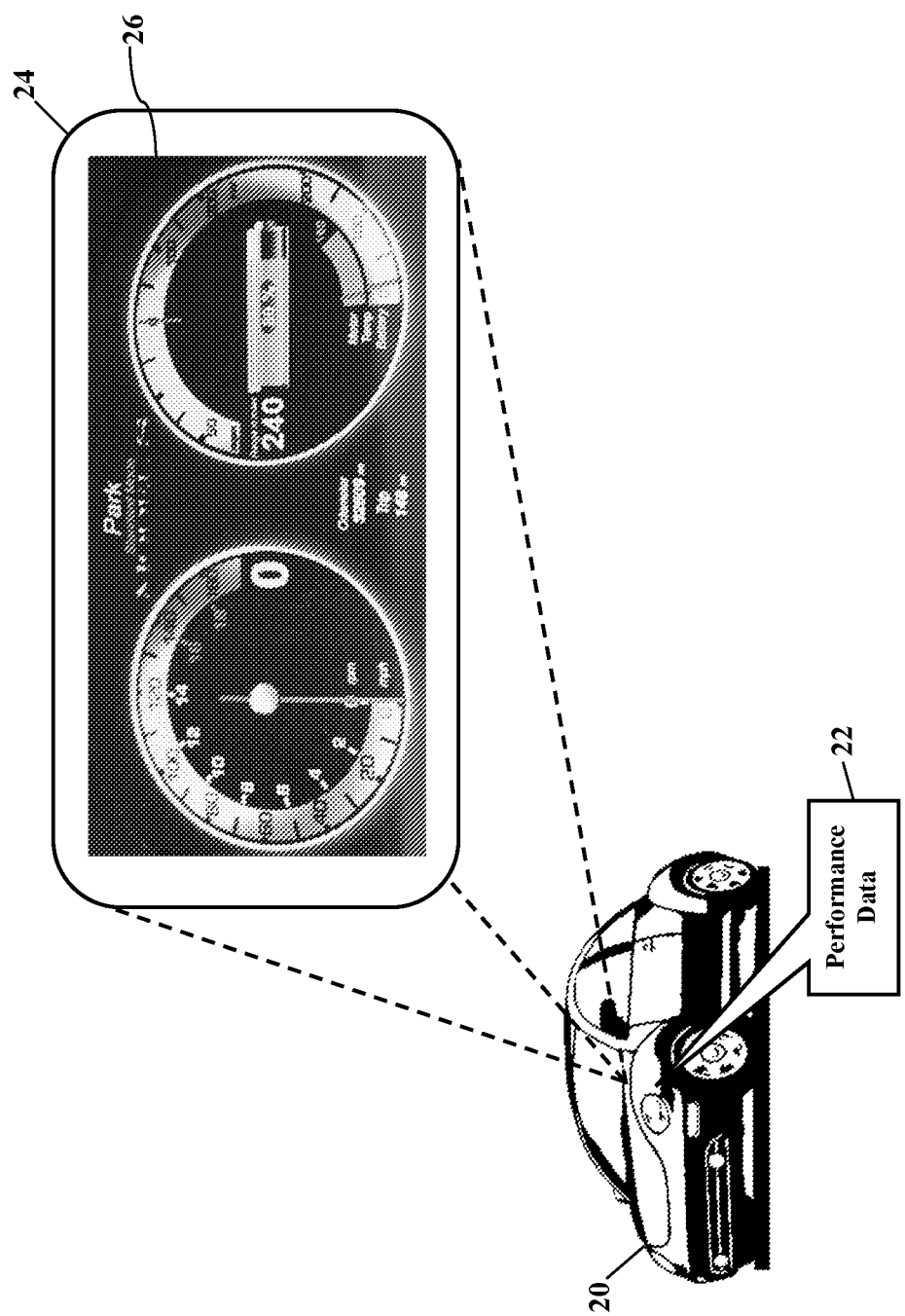
FIGS. 1-5 are simplified schematics illustrating an environment in which exemplary embodiments may be implemented.

The exemplary embodiments will now be described more fully hereinafter with reference to the accompanying drawings. The exemplary embodiments may, however, be embodied in many different forms and should not be construed as limited to the embodiments set forth herein. These embodiments are provided so that this disclosure will be thorough and complete and will fully convey the exemplary embodiments to those of ordinary skill in the art. Moreover, all statements herein reciting embodiments, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating the exemplary embodiments. The functions of the various elements shown in the figures may be provided through the use of dedicated hardware as well as hardware capable of executing associated software. Those of ordinary skill in the art further understand that the exemplary hardware, software, processes, methods, and/or operating systems described herein are for illustrative purposes and, thus, are not intended to be limited to any particular named manufacturer.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will also be understood that, although the terms first, second, etc. may be used herein to describe various elements, these elements should not be limited by these terms. These terms are only used to distinguish one element from another. For example, a first device could be termed a second device, and, similarly, a second device could be termed a first device without departing from the teachings of the disclosure.

FIGS. 1-5 are simplified schematics illustrating an environment in which exemplary embodiments may be implemented. As a vehicle 20 is driven, the vehicle 20 generates many different kinds of performance data 22. The performance data 22 may describe the vehicle's speed, miles driven, mileage, dates and times, and many other data measurements and messages. Ordinarily, at least some of the performance data 22 would be visually displayed to a driver of the vehicle 10. For example, the vehicle's speed, engine temperature, and mileage are displayed to the driver.

Here, though, exemplary embodiments transform a digital dashboard 24. The digital dashboard 24 is a display device or control panel that displays the performance data 22. The digital dashboard 24 is sometimes referred to as an instrument panel or fascia. Regardless, instead of displaying the performance data 22 in conventional fashion, exemplary embodiments mimic the display of any vehicle of the driver's choosing. That is, the driver may select any vehicle he or she prefers. Exemplary embodiments then reconfigure the digital dashboard 24 to display an interface 26 matching the driver's preferred vehicle. In simple terms, even though the driver owns and drives a conventional, gas-powered VOLKSWAGON® BEETLE®, the driver may select the interface 26 of an electric TESLA MOTORS® MODEL S®. Exemplary embodiments then display the performance data 22 on the digital dashboard 24, using the graphical interface 26 of the TESLA MOTORS® MODEL S®. The performance data 22, in other words, is formatted and displayed to match the graphical interface 26 of the MODEL S®. Even though the driver's existing car is the VOLKSWAGON® BEETLE®, exemplary embodiments simulate the driving experience of the MODEL S®. When the driver glances at the dashboard 24, the driver sees the graphical interface 26 of the MODEL S®. Exemplary embodiments thus imitate the visual experience of the driver's preferred vehicle.

Figure 2:
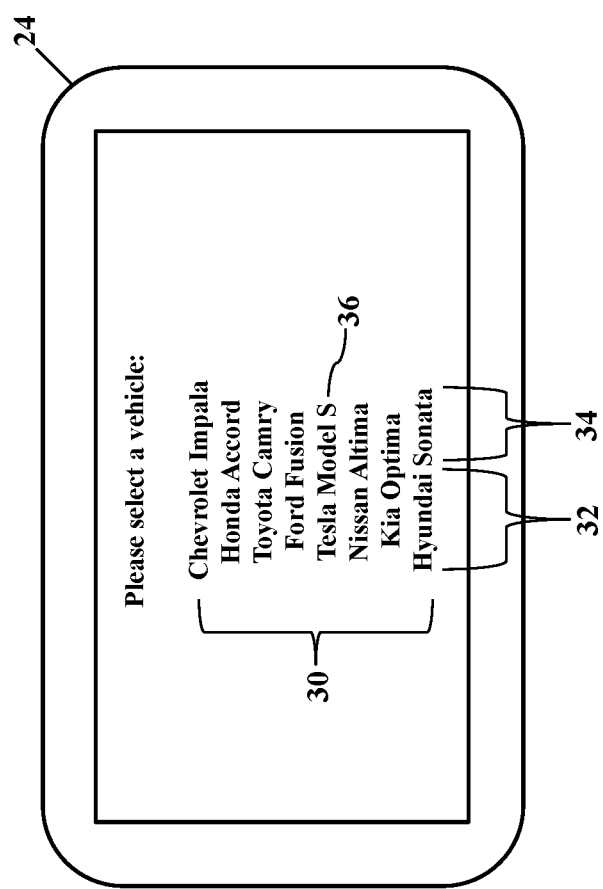
Figure 3:
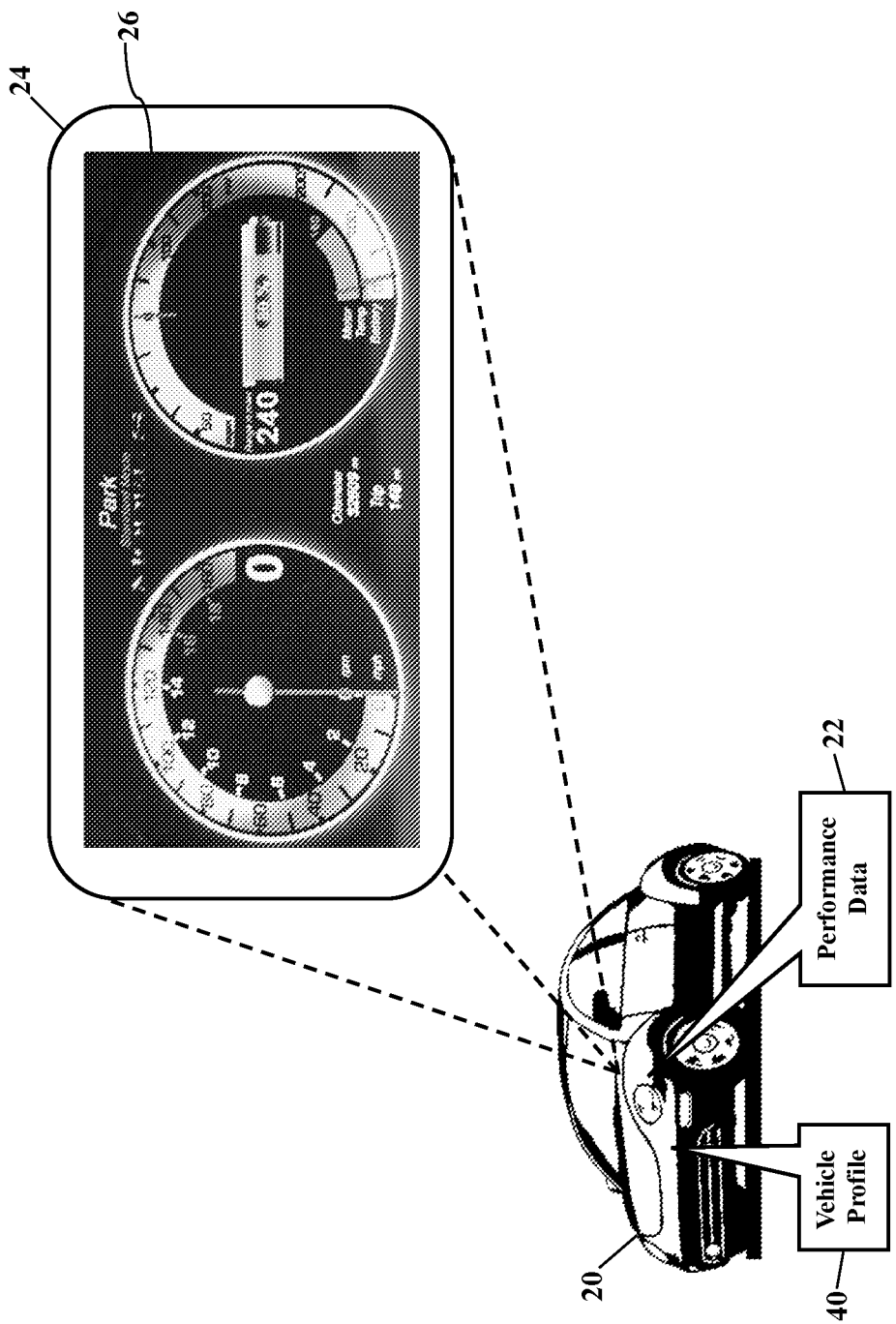

FIGS. 2-3 further illustrate the simulation. The digital dashboard 24 may display a menu 30 of vehicles. FIG. 2, for simplicity, only illustrates several different options in the menu 30 of vehicles. In practice, though, the menu 30 of vehicles may be any graphical user interface that presents a listing of many different manufacturers 32 and/or models 34 of vehicles. The driver touches or otherwise selects any one of the vehicles in the menu 30 of vehicles. Continuing with the same example, suppose the driver selects an option 36 corresponding to the TESLA MOTORS® MODEL S®. FIG. 3 thus illustrates retrieval of a vehicle profile 40 that corresponds with the driver's option 36. Exemplary embodiments replace the manufacturer's OEM, production interface and, instead, format the performance data 22 for display using the vehicle profile 40 for the TESLA MOTORS® MODEL S®. The vehicle profile 40 thus contains information or instructions for recreating or replicating the graphical interface 26 that corresponds with the driver's option 36. FIG. 3 thus illustrates the dashboard 24 altered and configured to match the interface 26 of the TESLA MOTORS® MODEL S®, according to the vehicle profile 40. Again, even though the driver's existing vehicle 20 is a VOLKSWAGON® BEETLE®, the dashboard 24 displays the performance data 22 using the different interface 26 of the MODEL S®. Exemplary embodiments thus mimic the visual, dashboard experience of driving the MODEL S®.

Figure 4:
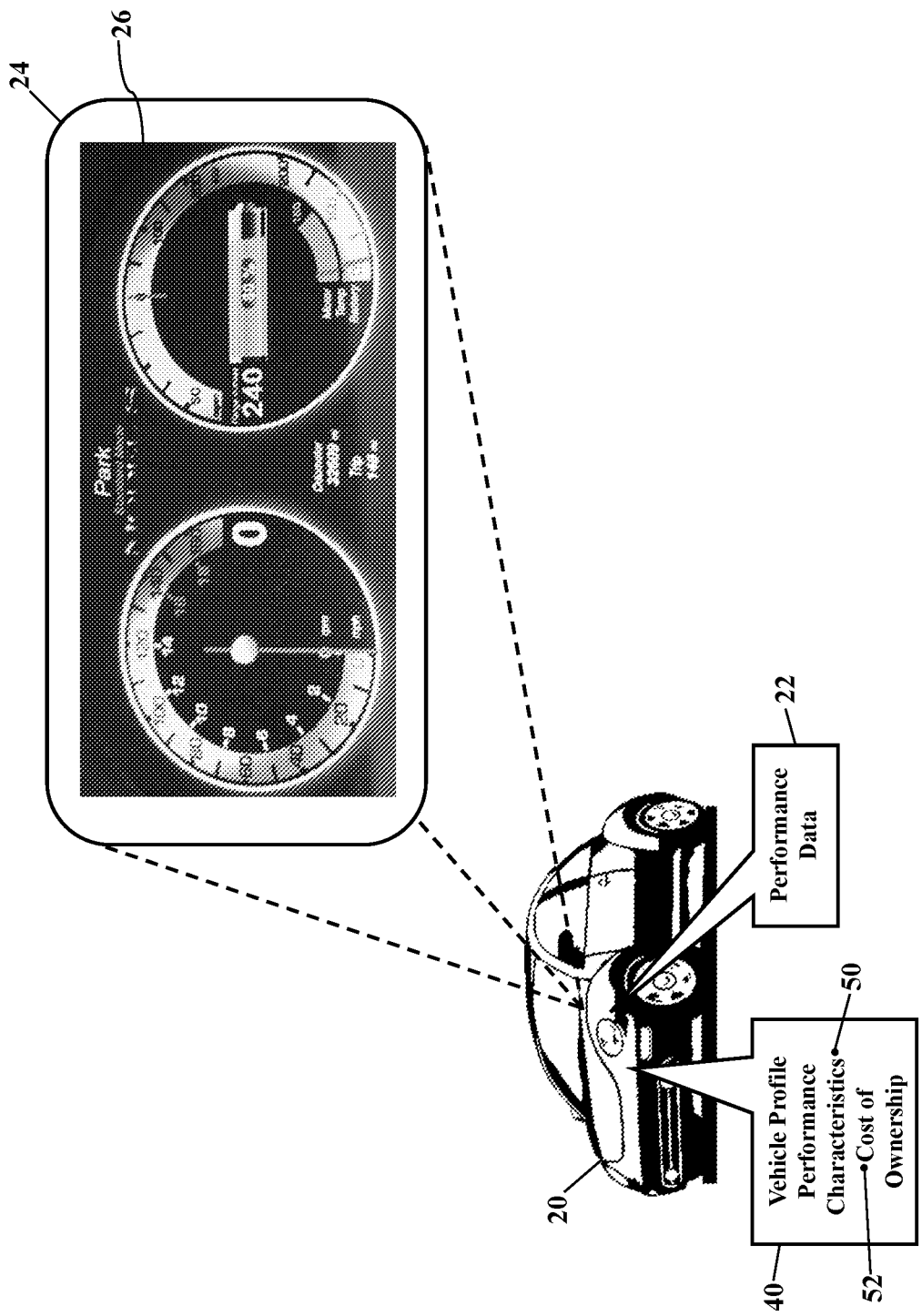

FIG. 4 further illustrates the simulation. Not only may exemplary embodiments simulate the interface 26 of different vehicles, but exemplary embodiments may also make comparisons and estimations using the performance data 22. When the profile 40 of the preferred vehicle is retrieved, the profile 40 may also contain known performance characteristics 50 for the same preferred vehicle. Continuing with the same example, exemplary embodiments may thus compare the performance data 22, obtained from the driver's VOLKSWAGON® BEETLE®, to the known performance characteristics 50 of the TESLA MOTORS® MODEL S®. Exemplary embodiments may thus estimate a cost 52 of ownership for the MODEL S®, using the performance data 22 from the driver's VOLKSWAGON® BEETLE®.

Exemplary embodiments thus help with purchasing decisions. When the performance data 22 is compared to the known performance characteristics 50, many performance, efficiency, and cost comparisons may be made. The performance data 22, for example, may describe the driver's driving habits, such as any measure of braking or acceleration over time. Exemplary embodiments may compare the driver's performance data 22 to the known performance characteristics 50, yielding measures or estimates fuel mileage, electrical use, wear and tear, and depreciation. There are many known algorithms and concepts for determining the cost 52 of ownership, so no detailed explanation is needed. However, the cost 52 of ownership is determined, and exemplary embodiments may help the driver make his or her purchasing decision.

Figure 5:
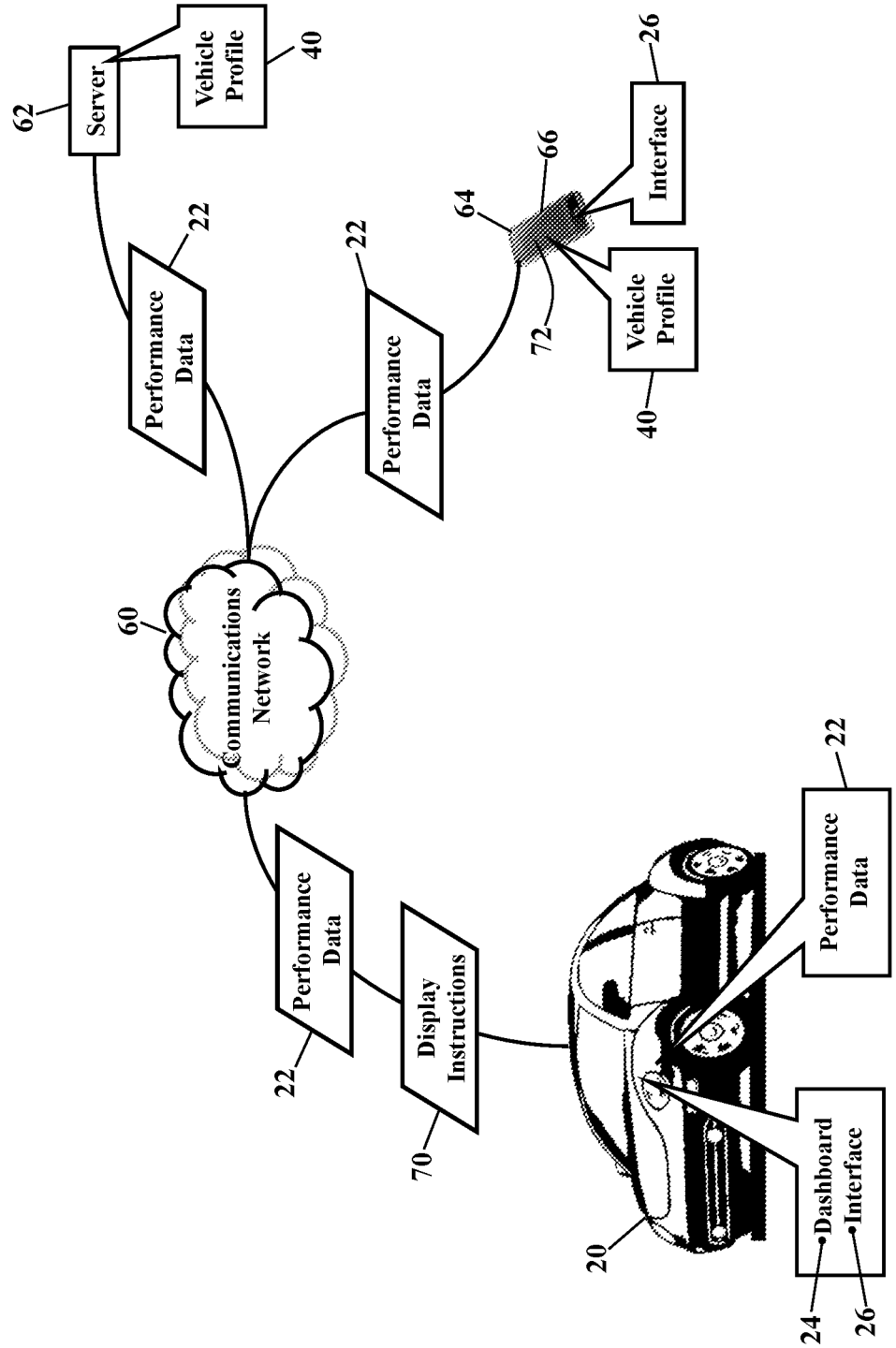

FIG. 5 illustrates different processing options. The performance data 22 may be locally processed and analyzed by any component in the vehicle 20 (as later paragraphs will explain). The performance data 22, however, may be uploaded using a communications network 60 to a remote server 62 and/or to a mobile device 64 (such as the driver's smartphone 66). The server 62 and/or the mobile device 64 may then compare the performance data 22 to the profile 40 chosen by the driver. Display instructions 70 may be generated and sent back to the vehicle 20, so that the dashboard 24 mimics the appropriate interface 26. The mobile device 64 may additionally or alternatively display the altered interface 26 on its display device 72. Exemplary embodiments may thus locally or remotely simulate the interface 26 of the driver's preferred vehicle.

Exemplary embodiments provide simple, virtual test drives. Users may drive their personal vehicles and, yet, experience different vehicles. Whatever the driver's existing vehicle, the dashboard 24 may be configured to match any option in the menu 30 of vehicles. If the menu 30 of vehicles lacks an option for a particular vehicle, searches may be conducted for applications mimicking the preferred vehicle (as later paragraphs will explain). The cost 52 of ownership may also be determined, thus further helping the driver make purchase decisions. Drivers may thus experience any vehicle of their choice, thus providing inexpensive, virtual test drives of many different vehicles.

Exemplary embodiments are especially helpful for electric vehicles. Electric vehicles are expensive, often costing several thousand dollars more than a conventional, gas-powered, internal combustion vehicle. Potential buyers of electric vehicles thus want to determine whether the added cost is recouped in gasoline savings. Moreover, all-electric vehicles are often limited in driving range, so potential buyers may also have range anxiety. Exemplary embodiments thus allow a potential electric vehicle customer to virtually test drive an electric car prior to making a purchase decision. As potential customers drive their existing personal car, exemplary embodiments mimic what is seen on the dashboard 24 of the prospective electric vehicle. Exemplary embodiments may thus use the performance data 22 to estimate the cost 52 of ownership for the prospective electric vehicle. Current and/or long-term driving habits may be used to determine the cost 52 of ownership, yielding potential savings and a long-term payback of the initial purchase price.

Exemplary embodiments are applicable to any vehicle. Internal combustion engines are predominant in today's automotive industry, so conventional gas-powered vehicles are mainly described. A driver, though, may select the profile 40 for any hybrid electric vehicle. Indeed, profiles 40 may be available for vehicles having any propulsion technique or concept, such as hydrogen fuel cells, flywheels, and natural gas.

Figure 6:
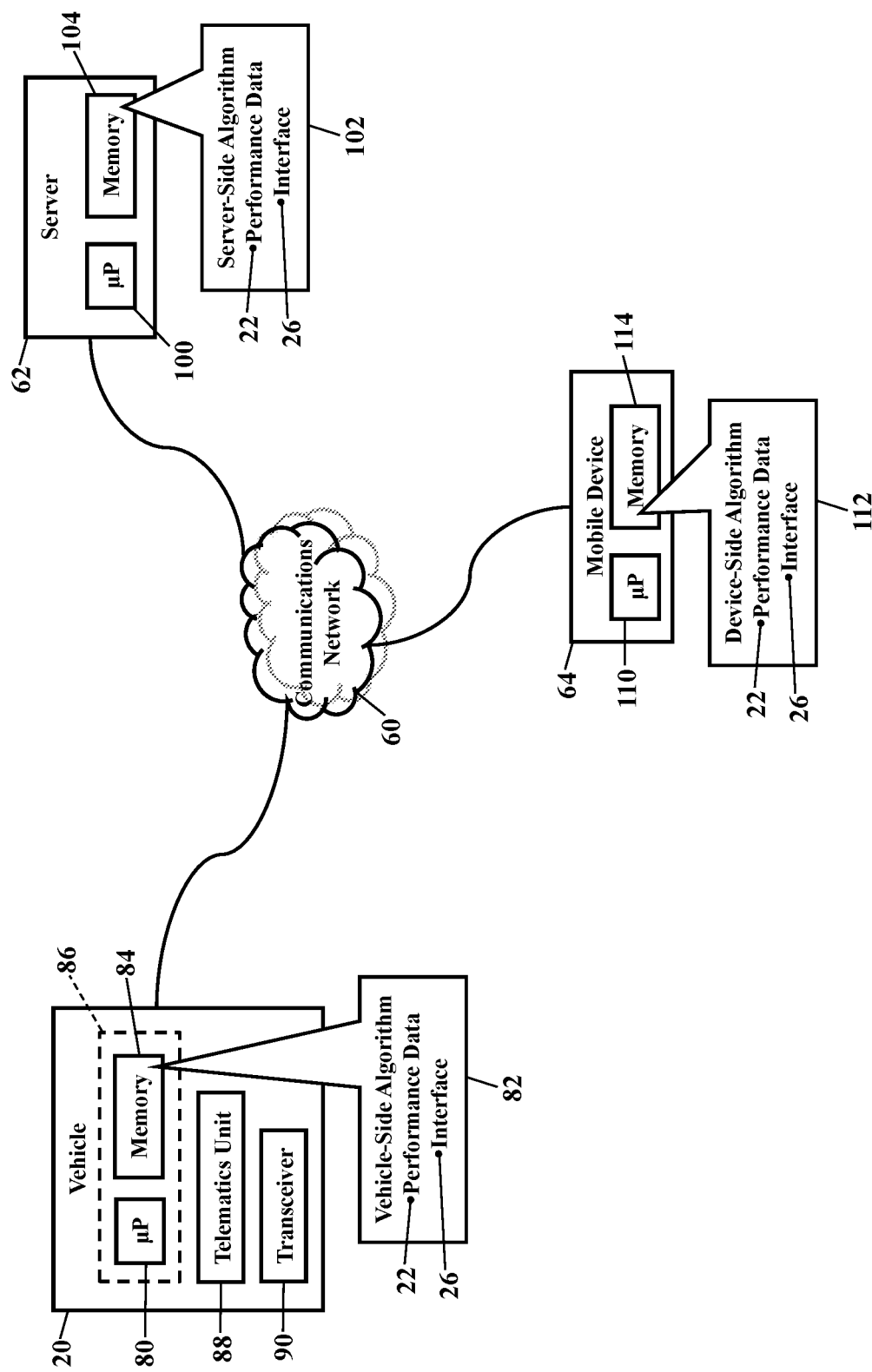
FIG. 6 is a more detailed block diagram illustrating the operating environment, according to exemplary embodiments.

FIG. 6 is a more detailed block diagram illustrating the operating environment, according to exemplary embodiments. FIG. 6 illustrates the communications capabilities between the vehicle 20, the server 62, and the mobile device 64. The vehicle 20 has a processor 80 (e.g., "µP"), application specific integrated circuit (ASIC), or other component that executes a vehicle-side algorithm 82 stored in a local memory 84. The vehicle 20, for example, has many processor-controlled controllers 86 for controlling the engine, transmission, chassis, and many other components. The vehicle 20 may also have a telematics unit 88 that interfaces with the controller 86 to obtain any of the performance data 22. The vehicle 20 may also have a transceiver 90 that wirelessly sends/receives information to/from the server 62 and/or the mobile device 64. The vehicle-side algorithm 82 may obtain the performance data 22 from any of these vehicular components. The vehicle-side algorithm 82 may process the performance data 22 to generate the interface 26 of the driver's choosing, as earlier paragraphs explained.

Exemplary embodiments, however, may include remote processing. Some or all of the performance data 22, for example, may be processed by the server 62 and/or by the mobile device 64. As FIG. 6 also illustrates, the server 62 may also have a processor 100 (e.g., "μP"), application specific integrated circuit (ASIC), or other component that executes a server-side algorithm 102 stored in a local memory 104. The mobile device 64 may also have a processor 110 (e.g., "μP"), application specific integrated circuit (ASIC), or other component that executes a device-side algorithm 112 stored in a local memory 114. The vehicle-side algorithm 82, the server-side algorithm 102, and the device-side algorithm 112 may thus include instructions, code, and/or programs that cooperate, perhaps in a server-client relationship, via the communications network 60, to mimic the different interfaces 26 of different makes and models of vehicles.

Exemplary embodiments may utilize any processing component, configuration, or system. Any of the processors could be multiple processors, which could include distributed processors or parallel processors in a single machine or multiple machines. Any of the processors could include virtual processor(s). Any of the processors could include a state machine, application specific integrated circuit (ASIC), programmable gate array (PGA) including a Field PGA, or state machine. When any of the processors execute instructions to perform "operations", this could include the processor performing the operations directly and/or facilitating, directing, or cooperating with another device or component to perform the operations.

Exemplary embodiments may be applied regardless of networking environment. As the above paragraphs mentioned, the communications network 60 may be a wireless network having cellular, WI-FI®, and/or BLUETOOTH® capability. The communications network 60, however, may be a cable network operating in the radio-frequency domain and/or the Internet Protocol (IP) domain. The communications network 60, however, may also include a distributed computing network, such as the Internet (sometimes alternatively known as the "World Wide Web"), an intranet, a local-area network (LAN), and/or a wide-area network (WAN). The communications network 60 may include coaxial cables, copper wires, fiber optic lines, and/or hybrid-coaxial lines. The communications network 60 may even include wireless portions utilizing any portion of the electromagnetic spectrum and any signaling standard (such as the IEEE 802 family of standards, GSM/CDMA/TDMA or any cellular standard, and/or the ISM band). The communications network 60 may even include power line portions, in which signals are communicated via electrical wiring. The concepts described herein may be applied to any wireless/wireline communications network, regardless of physical componentry, physical configuration, or communications standard(s).

The vehicle's dashboard 24 is configurable. The dashboard 24 may be any display device, that uses any technology, to permit adoption of the chosen vehicle's interface 26. The dashboard 24, for example, may be an LCD, LED, or plasma display that changes pixel excitations. The dashboard 24 may further have touch sensing capabilities, such as a capacitive touch sensor overlaying or above the display device.

Figure 7:
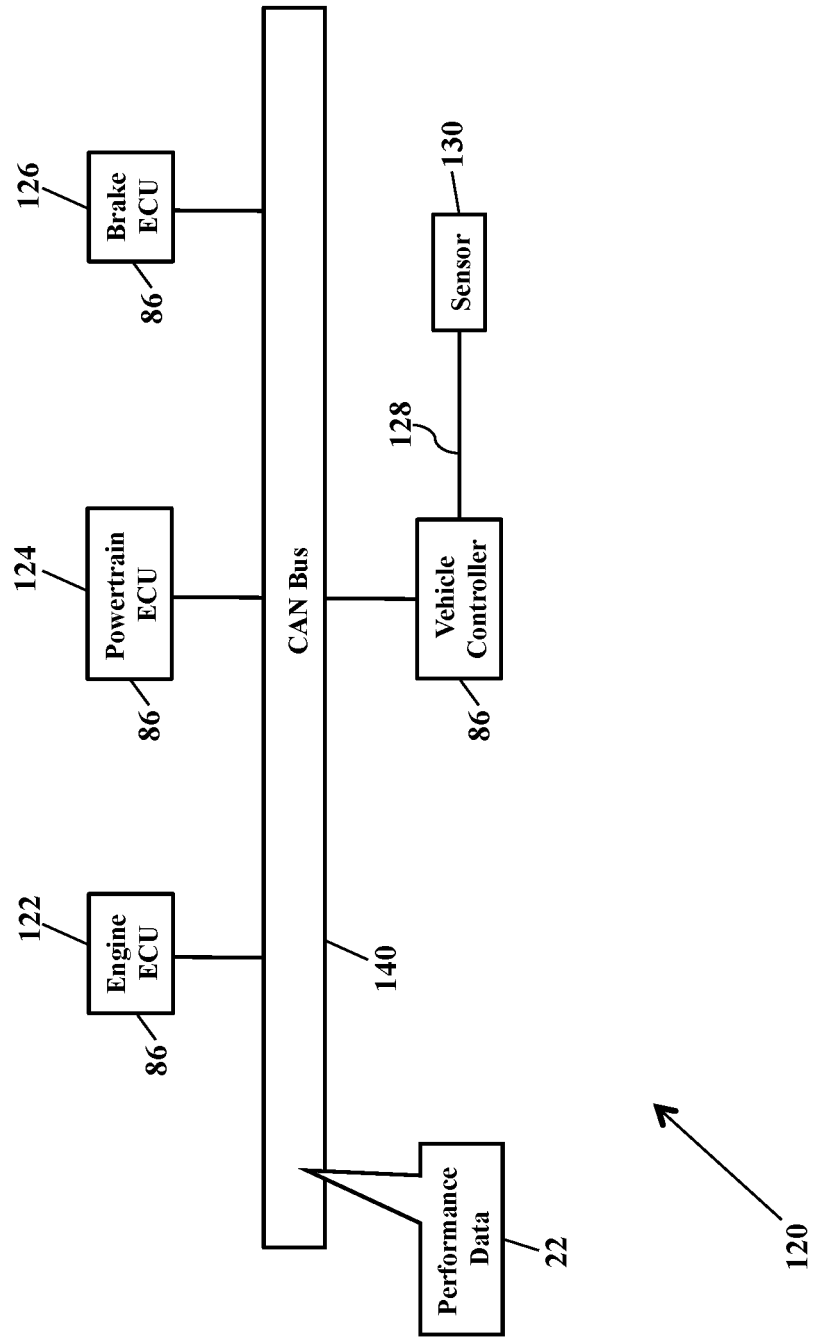
FIGS. 7-12 are diagrams illustrating performance data, according to exemplary embodiments.

FIGS. 7-12 are diagrams illustrating the performance data 22, according to exemplary embodiments. As this disclosure explains, the vehicle (illustrated as reference numeral 20 in FIG. 1) has many different controllers 86 that generate many different kinds of the performance data 22. The performance data 22 may describe the vehicle's speed, miles driven, mileage, dates and times, and many other data measurements and messages. FIG. 7, for example, illustrates a controller area network (or "CAN") 120. The controller area network 120 allows all the various controllers 86 to communicate with each other. The controller 86 may sometimes be referred to as an electronic control unit (or "ECU") or electronic control module (or "ECM"). The vehicle's engine, for example, may have an engine electronic control unit 122. The transmission may have a powertrain electronic control unit 124. The braking system may have a brake electronic control unit 126. Each controller 86 may receive one or several inputs 128 from one or more sensors 130. There may be many more controllers 86 throughout the vehicle 10. A CAN bus 140 allows the various controllers 86 to send and receive messages using addressing. The performance data 22 may thus be any information or message that is sensed by the sensor 130, determined by any controller 86, and/or sent along the CAN bus 140.

Figure 8:
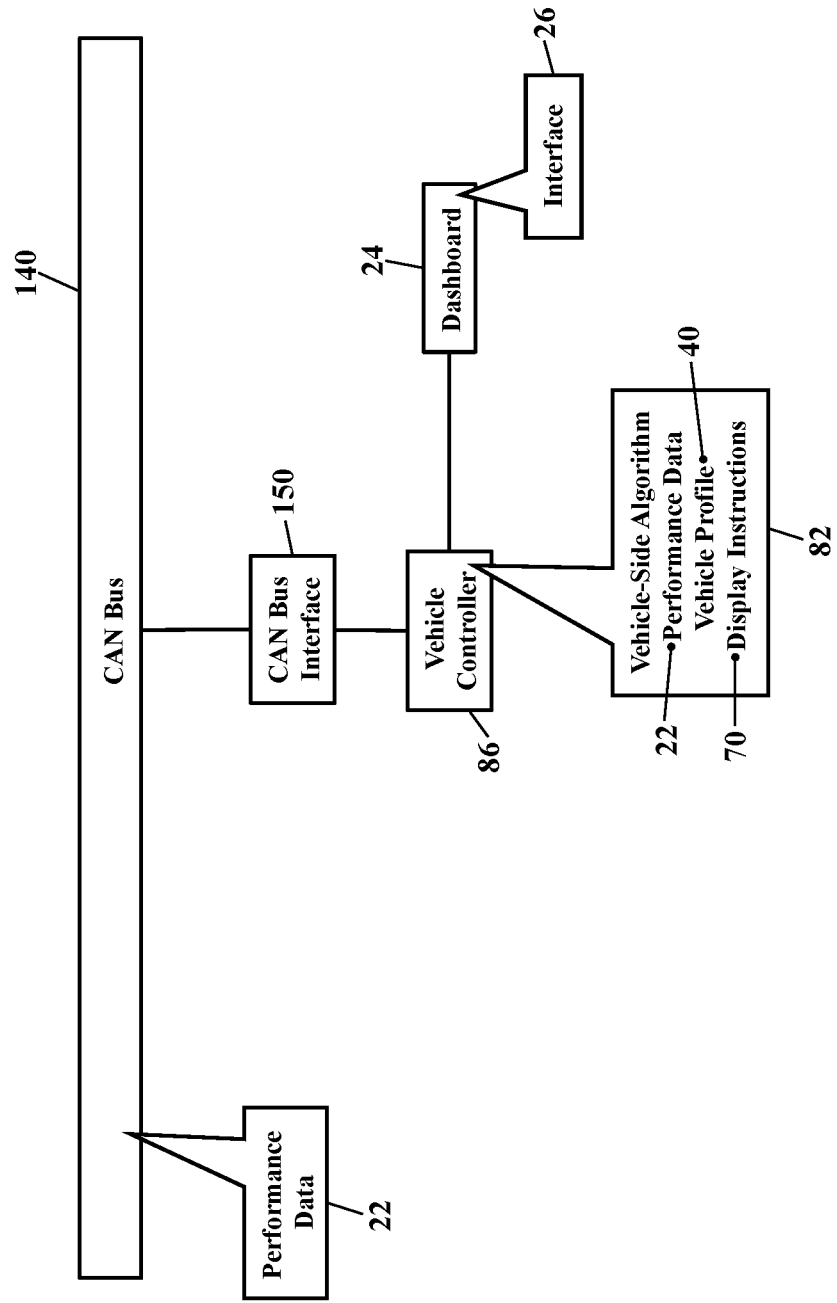

FIG. 8 illustrates the vehicle-side algorithm 82. The vehicle-side algorithm 82 may utilize a CAN Bus interface 150 to the CAN bus 140, allowing the vehicle-side algorithm 82 to receive or pick any performance data 22 from the CAN bus 140. The vehicle-side algorithm 82 may then cause the controller 86 to retrieve the vehicular profile 40 of the comparison vehicle (e.g., the driver's preferred vehicle selected from the menu 30 of vehicles, as illustrated with reference to FIG. 2). The vehicle-side algorithm 82 may instruct the controller 86 to compare the performance data 22 to the profile 40. The vehicle-side algorithm 82 may then locally generate the display instructions 70 that cause the dashboard 24 to mimic the interface 26 of the comparison vehicle.

Figure 9:
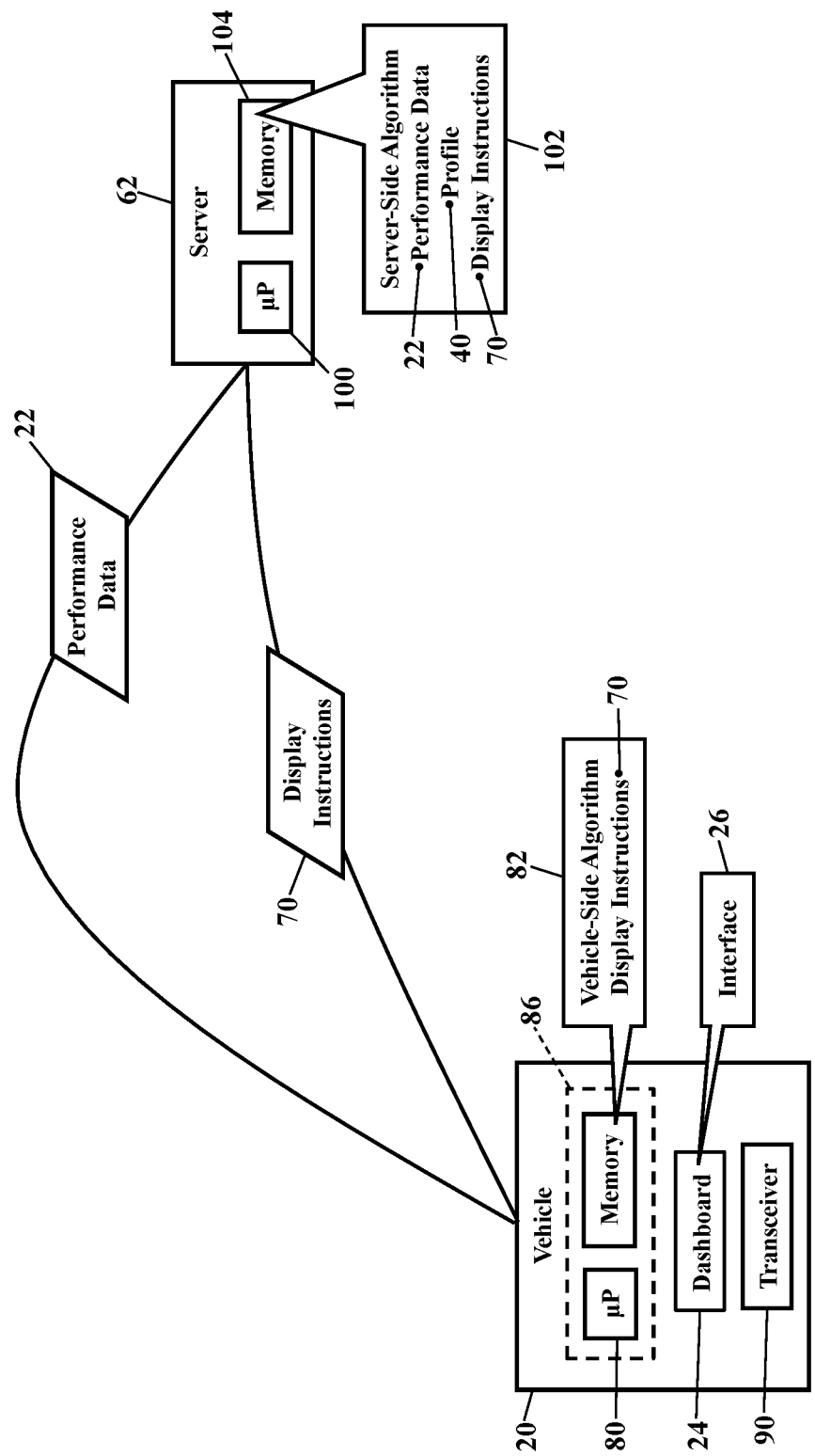

FIG. 9 illustrates remote processing. Here exemplary embodiments may upload any of the performance data 22 to the central server 62 for processing. The vehicle's transceiver 90, for example, may send the performance data 22 to the network address (e.g., Internet Protocol address) of the server 62. The server-side algorithm 102 may thus instruct the server's processor 100 to retrieve the profile 40 of the comparison vehicle (e.g., the driver's preferred vehicle selected from the menu 30 of vehicles, as illustrated with reference to FIG. 2). The server-side algorithm 102 instructs the processor 100 to compare the performance data 22 to the profile 40. The display instructions 70 are generated and sent back to the network address of the wireless transceiver 90. When the transceiver 90 receives the display instructions 70, the vehicle-side algorithm 82 instructs the vehicle processor 80 to process the display instructions 70 to mimic the interface 26 of the comparison vehicle on the dashboard 24.

Figure 10:
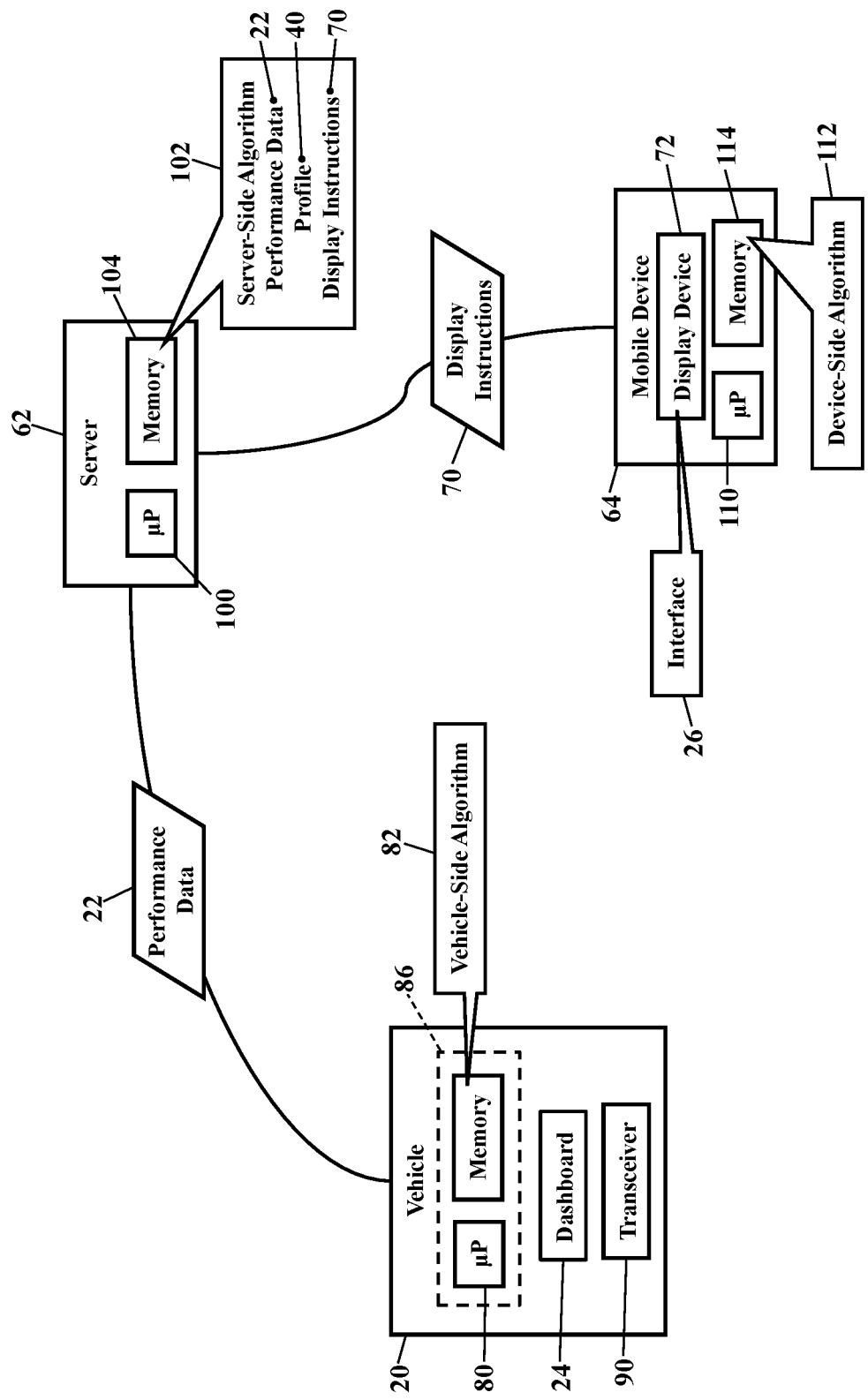

FIG. 10 illustrates mobile display. Here the performance data 22 may be uploaded to the central server 62, but the display instructions 70 may be additionally or alternatively sent to the mobile device 64. Once the display instructions 70 are generated by the server 62, the server-side algorithm 102 may instruct the server's processor 100 to send the display instructions 70 to the network address associated with the mobile device 64. When the mobile device 64 receives the display instructions 70, the device-side algorithm 112 instructs the device processor 110 to process the display instructions 70 for display on its display device 72. The driver's smartphone 66, in other words, mimics the interface 26 of the comparison vehicle.

Figure 11:
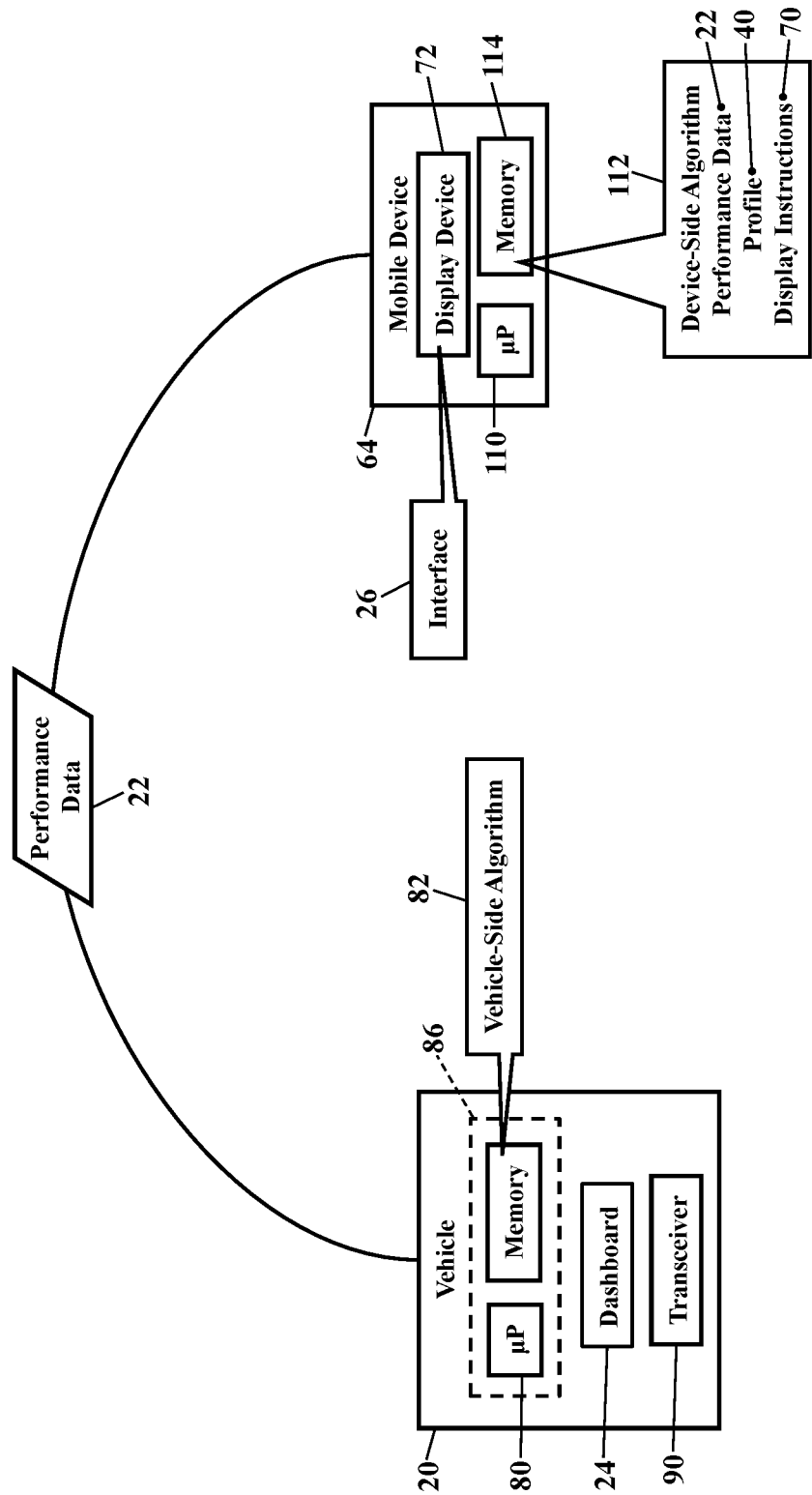
Figure 12:
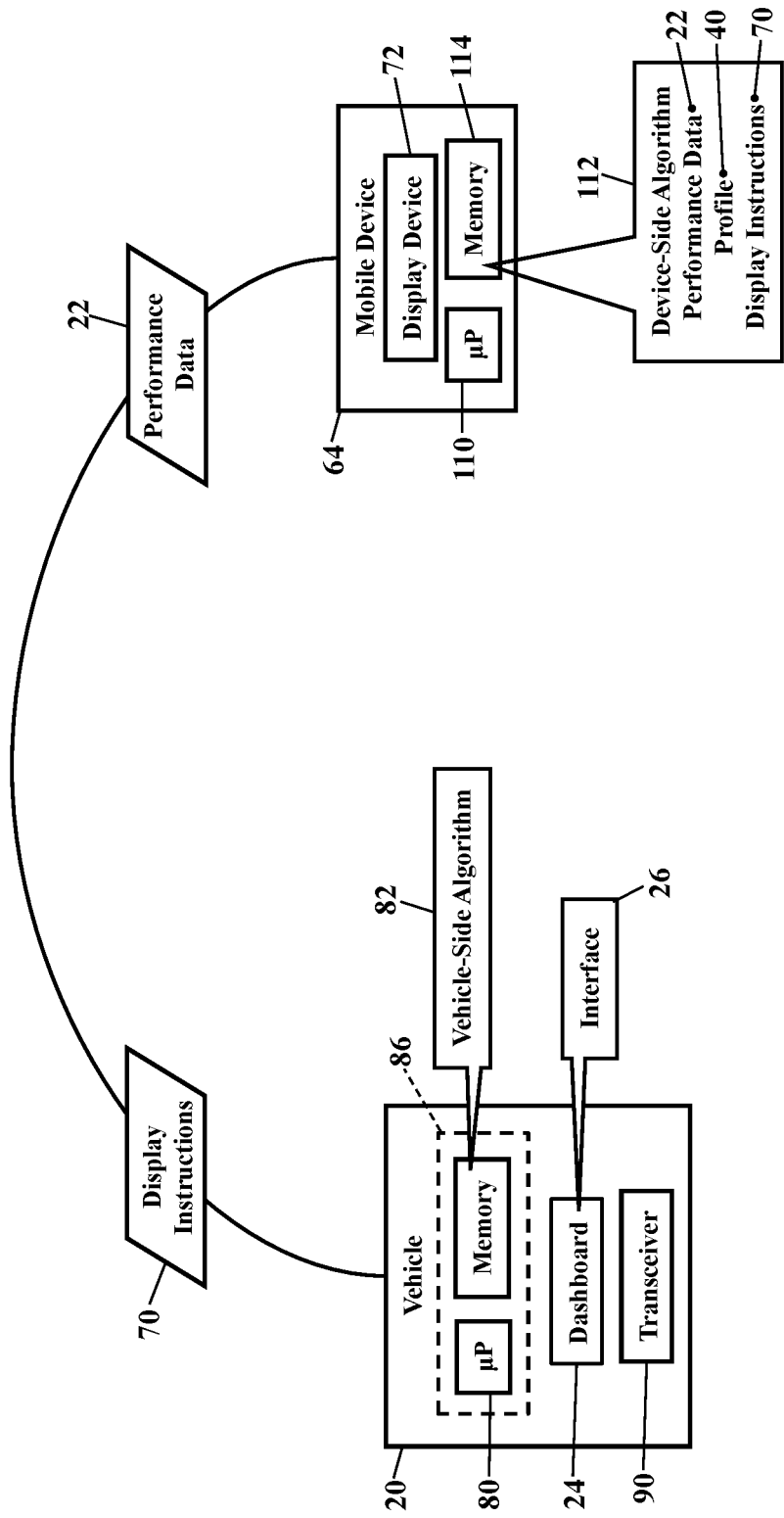

FIGS. 11-12 illustrate mobile processing. Here exemplary embodiments may upload the performance data 22 to the driver's mobile device 64 for processing. The vehicle's transceiver 90, for example, may interface with the mobile device 64 (such as a local, short range BLUETOOTH® connection) and send the performance data 22 to the mobile device 64. The vehicle's transceiver 90, however, may alternatively or additionally send the performance data 22 over a WI-FI® or cellular network to the network address (e.g., Internet Protocol address) of the mobile device 64. The device-side algorithm 112 instructs the device processor 110 to retrieve the profile 40 of the comparison vehicle, compare the performance data 22 to the profile 40, and to generate the display instructions 70. In FIG. 11, the display instructions 70 are locally executed for display on the display device 72 of the mobile device 64. In FIG. 12, though, the display instructions 70 are sent back to the vehicle's transceiver 90 for vehicular display by the dashboard 24. So, the driver's smartphone 66 may process the performance data 22, but the simulation may be presented at the vehicle 20.

The performance data 22 may be limited or comprehensive. There may be hundreds, or even thousands, of sensors, outputs, and messages generated by the modern vehicle 20. As this disclosure explains, the performance data 22 may describe the vehicle's speed, mileage, trip miles, dates and times, diagnostic codes, and global positioning system (GPS) location data. The performance data 22, in short, may be as comprehensive as needed to perform the comparison with the profile 40 of the comparison vehicle.

Figure 13:
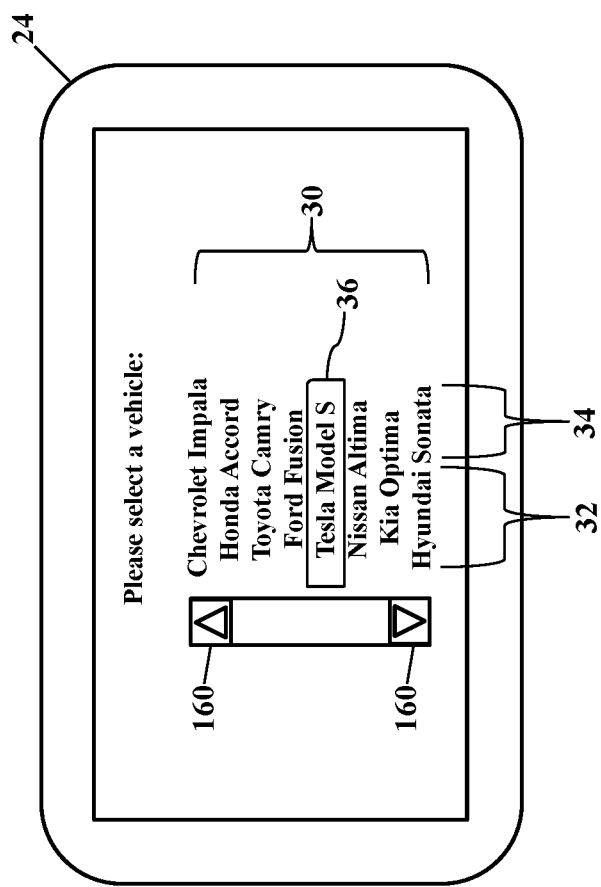
FIGS. 13-14 are diagrams illustrating retrieval of a profile, according to exemplary embodiments.
Figure 14:
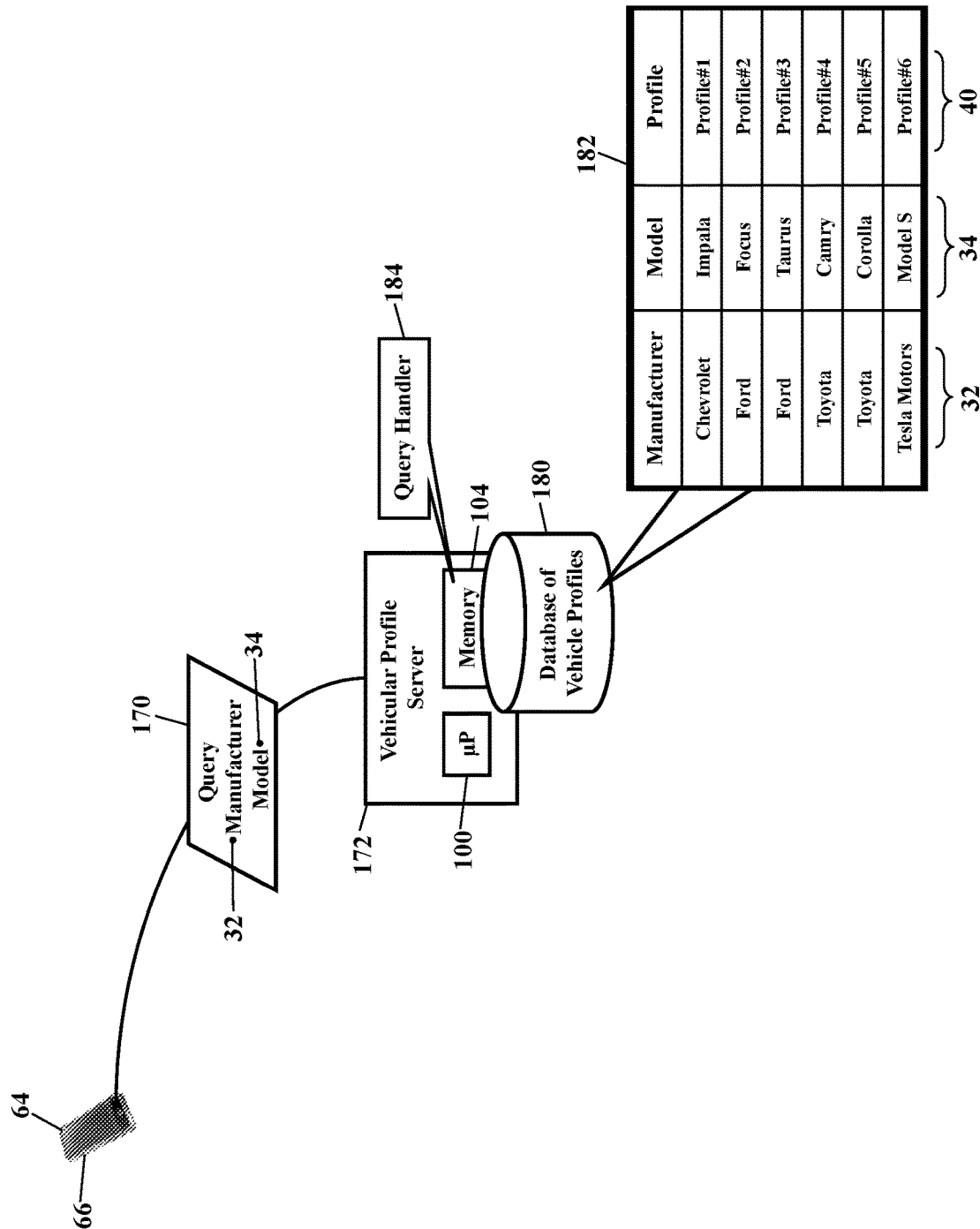

FIGS. 13-14 are diagrams illustrating retrieval of the profile 40, according to exemplary embodiments. The driver selects the manufacturer 32 and model 34 of the comparison vehicle from the menu 30 of vehicles. Exemplary embodiments may then retrieve the corresponding vehicle profile 40. The vehicle profile 40, for example, may be locally obtained. The above paragraphs thus explained local retrieval of the vehicle profile 40 by the vehicle 20, the server 62, and/or the mobile device 64, depending on the processing (as explained above).

Sometimes, though, the vehicle profile 40 may not be locally stored. The driver, for example, may choose a vehicle, from the menu 30 of vehicles, that is not locally stored. Indeed, the driver may even wish to select a vehicle not listed in the menu 30 of vehicles. FIG. 13 thus illustrates a search for the vehicle profile 40. As FIG. 13 illustrates, exemplary embodiments may display the menu 30 of vehicles as a graphical user interface with navigational controls 160. The navigational controls 160 allow scrolling along the menu 30 of vehicles. The driver may thus touch or move a cursor to select the option 36 for one of the vehicles in the menu 30 of vehicles.

FIG. 14 illustrates a profile search. If the driver's desired vehicle profile 40 is not locally stored, a query 170 may be sent to a vehicular profile server 172. For simplicity, FIG. 14 illustrates the query 170 originating from the driver's smartphone 66. The query 170, however, may originate from the vehicle 20. The query 170 includes a query parameter, such as the driver's selected manufacturer 32 and model 34 of comparison vehicle (e.g., the driver's option 36 from the menu 30 of vehicles, as FIG. 13 illustrated). The query 170 is sent to the network address associated with the vehicular profile server 172. The vehicular profile server 172 stores a database 180 of vehicle profiles. FIG. 14 illustrates the database 180 of vehicle profiles as a table 182 that maps, relates, or associates different comparison vehicles to their corresponding vehicle profile 40. Each entry in the database 180 of vehicle profiles may thus be populated with different profiles 40 for different manufacturers 32 and models 34 of comparison vehicles. When the vehicular profile server 172 receives the query 170, a query handler application 184 queries the database 180 of vehicle profiles for the manufacturer 32 and model 34 specified in the query 170. If an entry matches the manufacturer 32 and model 34, the query handler application 184 retrieves the corresponding file or information for the vehicle profile 40. The vehicular profile server 172 then sends the vehicle profile 40 as a query response to the network address of the requestor.

Figure 15:
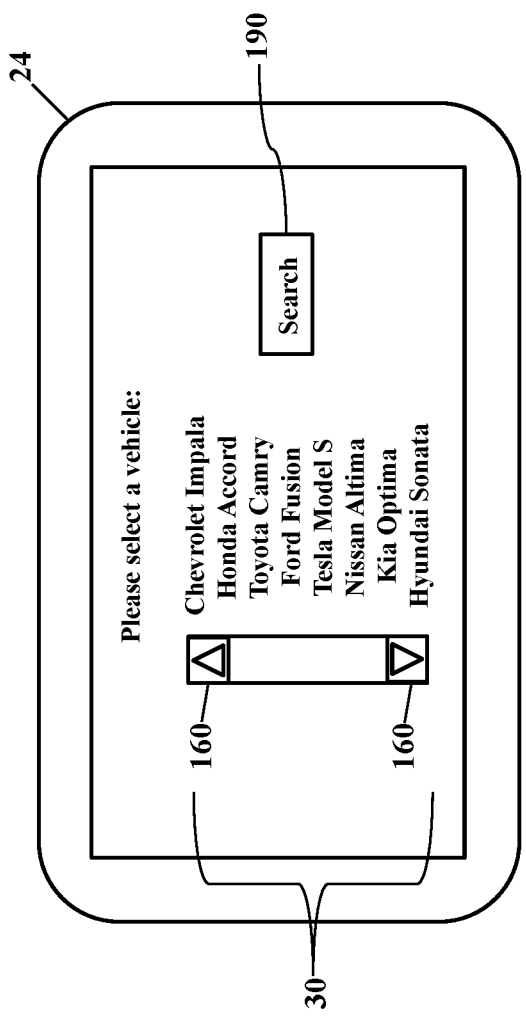
FIGS. 15-17 are diagrams illustrating a vehicular search, according to exemplary embodiments.
Figure 16:
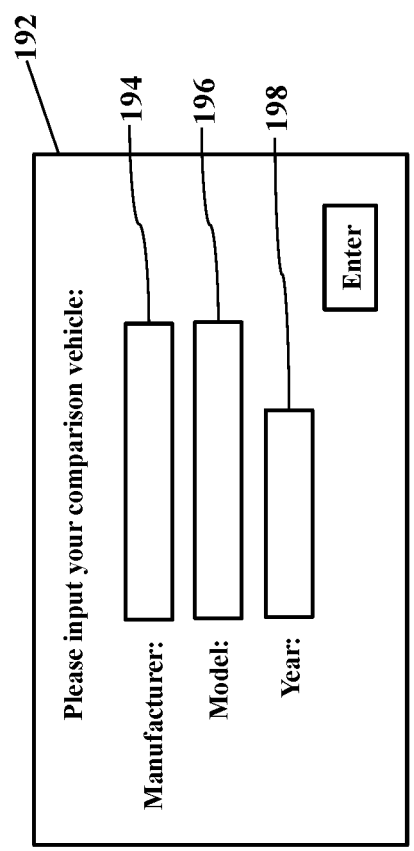
Figure 17:
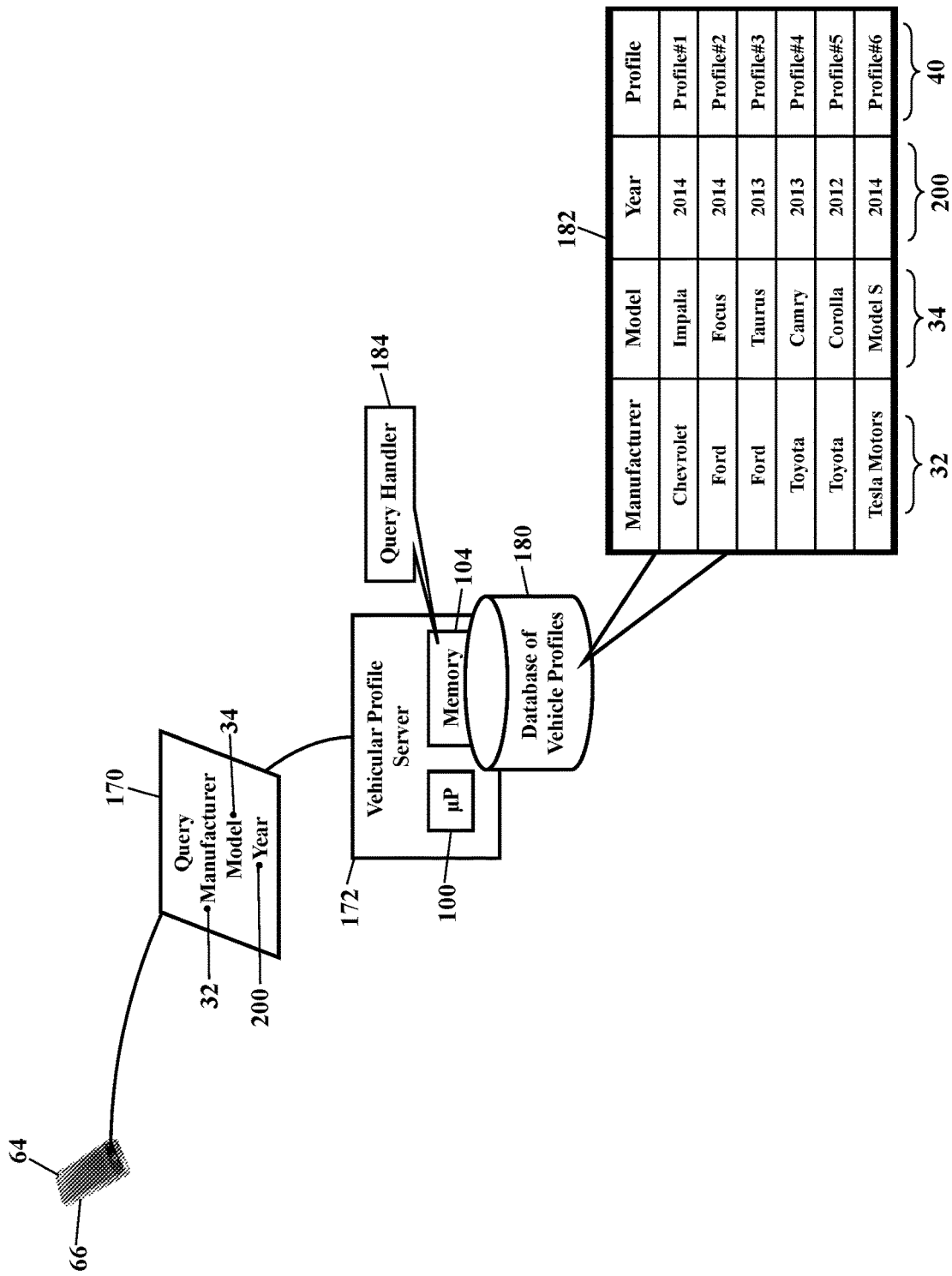

FIGS. 15-17 are diagrams illustrating a vehicular search, according to exemplary embodiments. As the driver scrolls along the menu 30 of vehicles, the driver's desired vehicle may not be listed. That is, the driver may wish to virtually test drive a vehicle that is not listed in the menu 30 of vehicles. Exemplary embodiments may thus display or include a graphical search control 190. When the search control 190 is selected, FIG. 16 illustrates a dialog box 192 that may be displayed. The dialog box 192 may have textual data fields for specifying her desired vehicle. The dialog box 192, for example, may display a manufacturer data field 194, a model data field 196, and a year data field 198. The driver/users types or enters the corresponding manufacturer, model, and year of her desired comparison vehicle. As FIG. 17 illustrates, exemplary embodiments send the query 170 specifying the manufacturer 32, the model 34, and year 200. When the vehicular profile server 172 receives the query 170, the query handler application 184 queries the database 180 of vehicle profiles for the manufacturer 32, model 34, and year 20. If a matching entry is determined, the corresponding vehicle profile 40 is retrieved and sent back to the requestor.

Exemplary embodiments thus include an application store. The vehicular profile server 172 may store the different vehicle profiles 40 for download. Difference vehicle profiles 40, for example, may be offered for a nominal fee, thus allowing inexpensive, virtual test drives of different vehicles. Indeed, either the vehicle-side algorithm 82 or the device-side algorithm 112 may also be offered as a free or fee-based downloadable application. Exemplary embodiments thus provide far cheaper, and far more convenient, opportunities for evaluating different vehicles.

Figure 18:
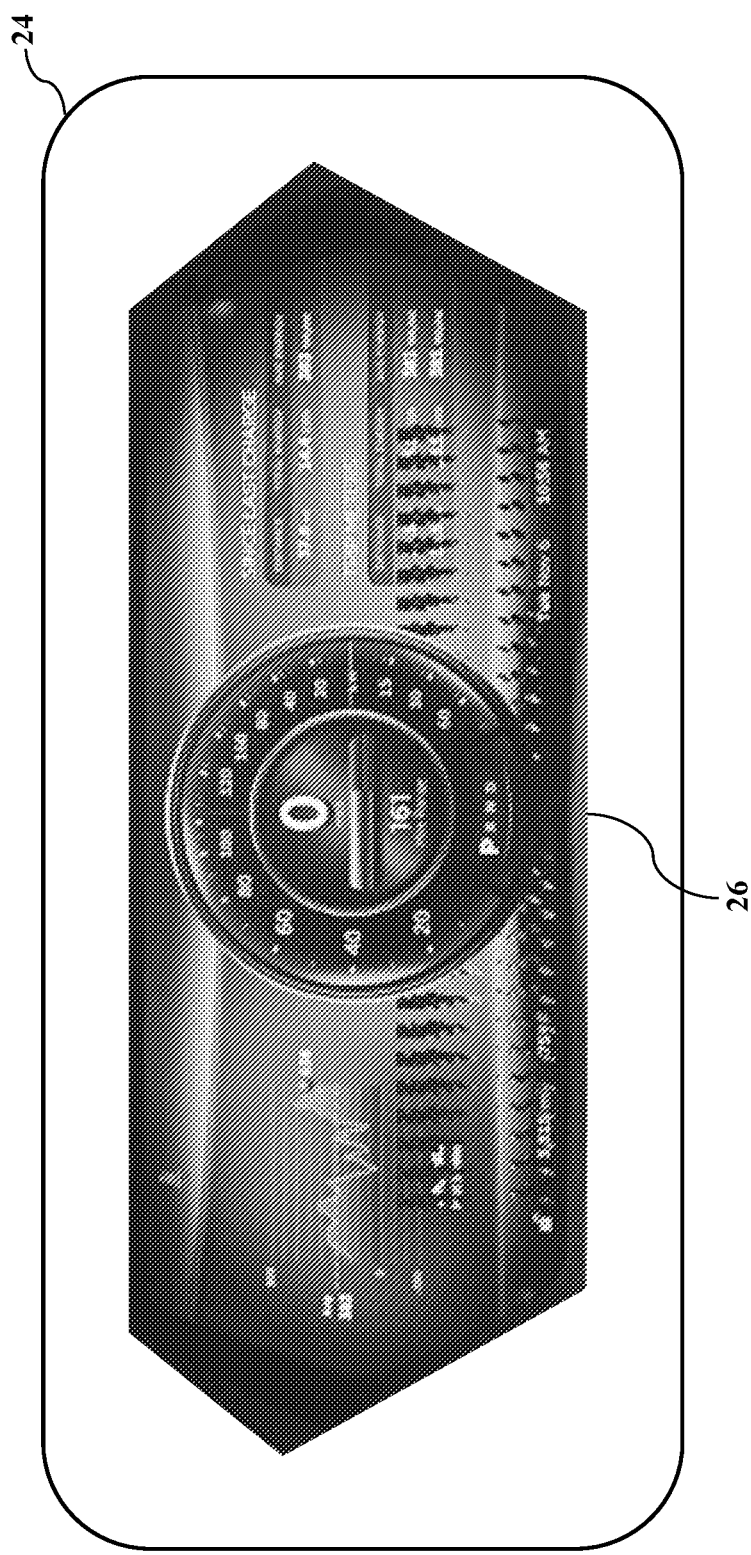
FIGS. 18-19 are diagrams illustrating charging considerations, according to exemplary embodiments.
Figure 19:
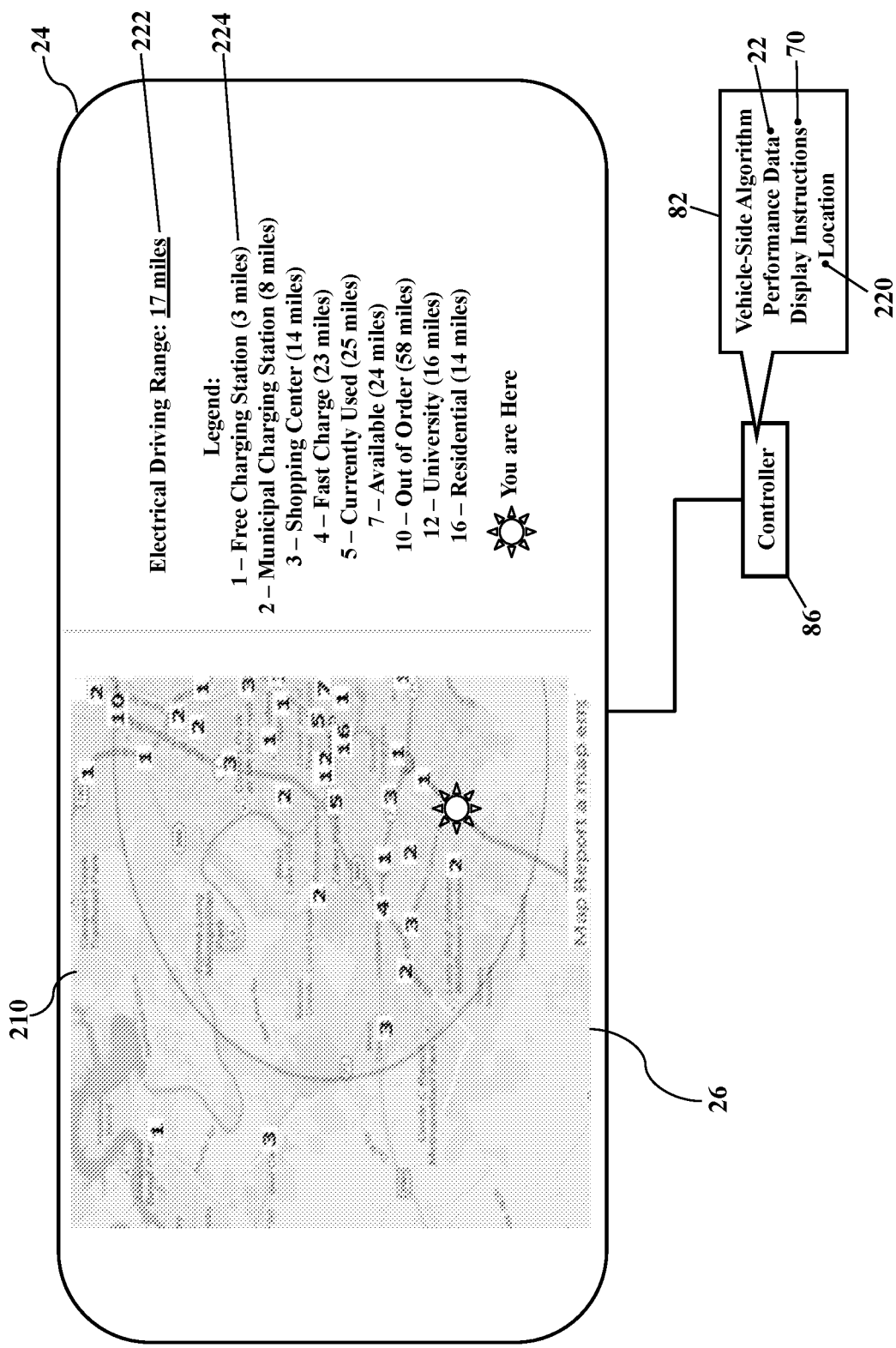

FIGS. 18-19 are diagrams illustrating charging considerations, according to exemplary embodiments. As this disclosure explains, virtual test drives of electric vehicles simplify the purchasing decision. Exemplary embodiments allow a prospective purchaser to determine if their driving habits (as represented by the performance data 22) justify the higher purchase price of an electric vehicle. Exemplary embodiments allow the driver to mimic the graphical interface 26 of any electric vehicle, even displaying the calculated cost 52 of ownership. Once the profile 40 is obtained for the electric vehicle, the driver's currently owned, existing vehicle 20 (such as a conventional, gas-powered car or truck) may thus simulate what the driver would see on the dashboard 24 of the prospective electric car. As FIG. 18 illustrates, the dashboard 24 of the driver's conventional, gas-powered car may thus display the graphical interface 26 of an electric vehicle, such as a simulated battery state, electrical driving range, and any measure of efficiency for optimizing battery life or the driving range.

As FIG. 19 illustrates, the dashboard 24 may also display a map 210 of charging stations. Even though the driver's conventional, gas-powered car (or hybrid vehicle) may not require charging stations, exemplary embodiments may still simulate charging requirements. Exemplary embodiments, then, may include a display option for locating charging stations. The performance data 22, as earlier explained, may include the current location 220 of the vehicle 20. The vehicle-side algorithm 82 (or the server-side algorithm 102 or the device-side algorithm 112) may thus query for the locations of the nearby charging stations matching the current location 220 of the vehicle 20. Exemplary embodiments may thus cause the dashboard 24 to display or overlay the map 210 of charging stations, thus emphasizing a remaining electrical driving range 222 before a simulated charging is required. The vehicle-side algorithm 82, for example, may calculate and display the distance 224 to different charging stations. Indeed, routes may be determined and displayed to the closest charging stations. Maps of charging stations are currently available, so no detailed explanation is needed.

Figure 20:
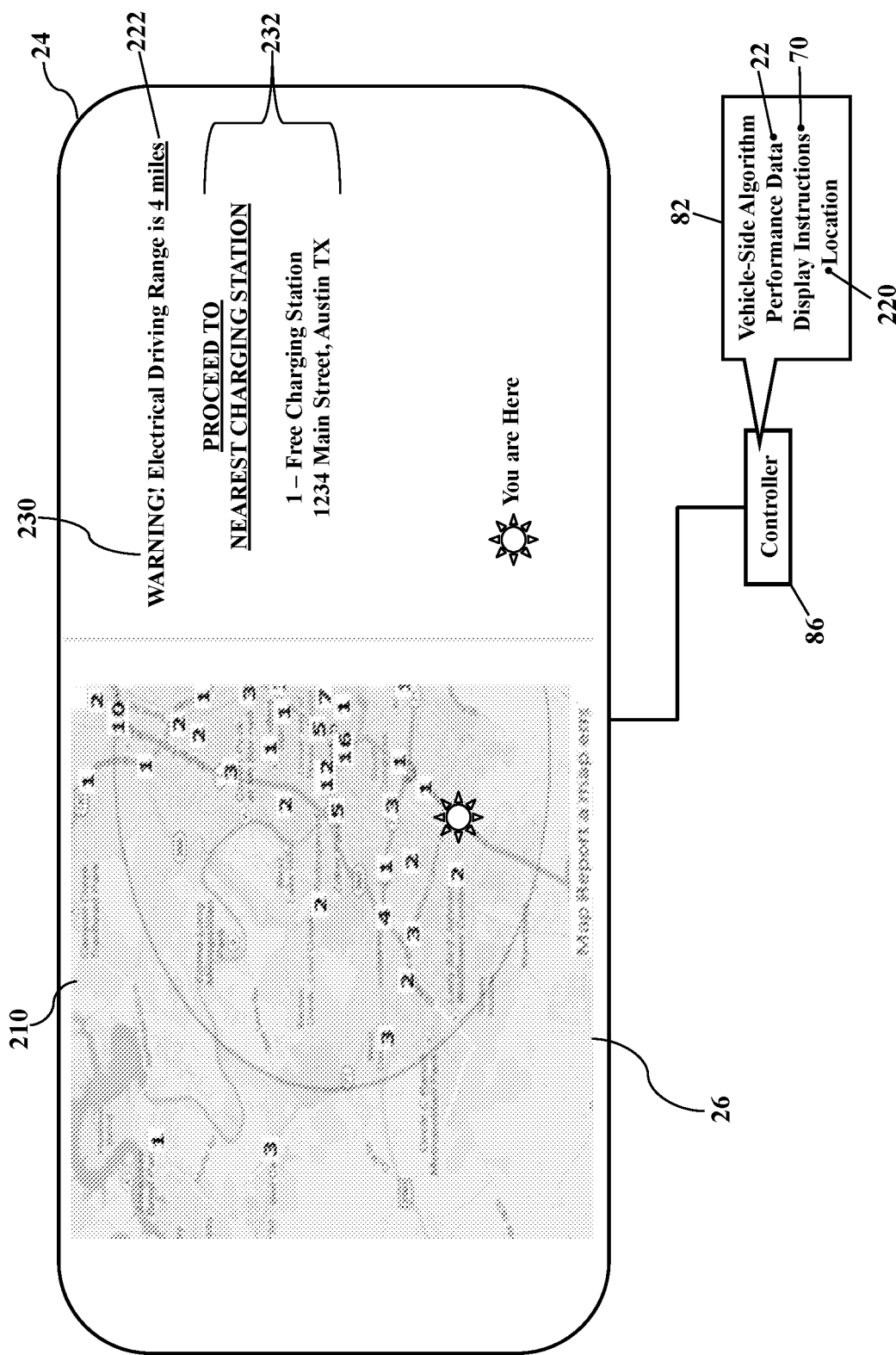
FIGS. 20-22 are diagrams illustrating a simulated charging cycle, according to exemplary embodiments.
Figure 21:
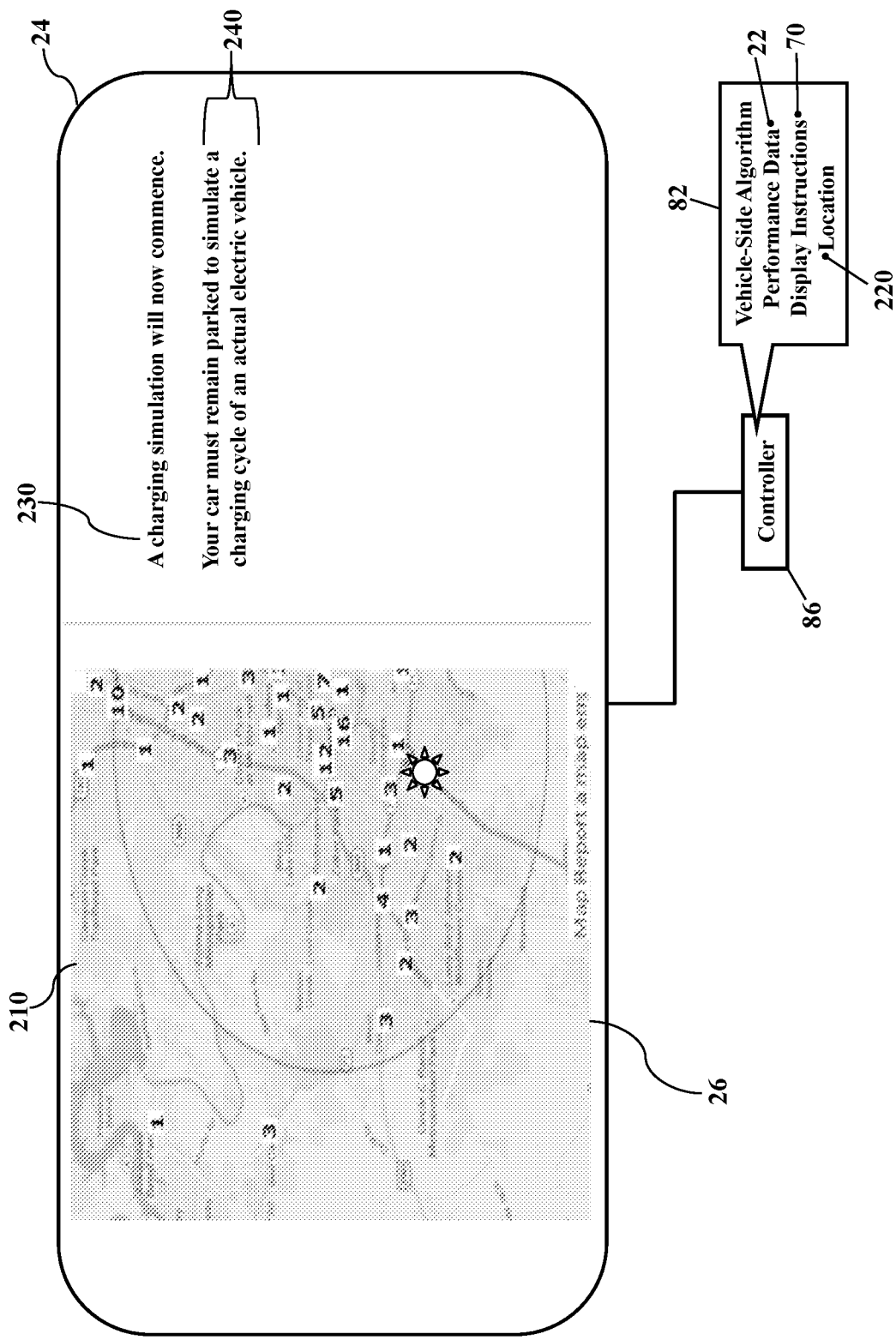
Figure 22:
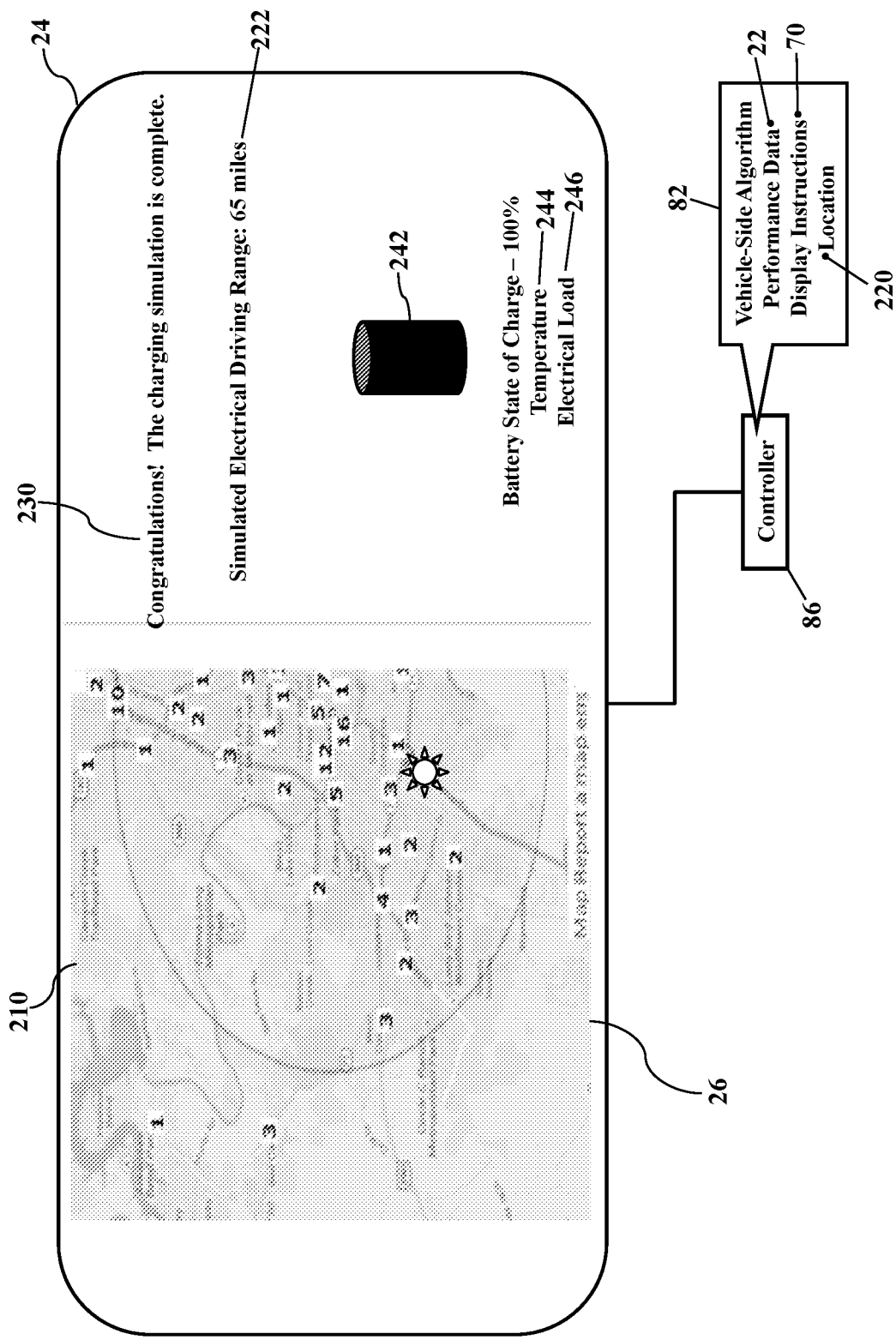

FIGS. 20-22 are diagrams illustrating a simulated charging cycle, according to exemplary embodiments. Even though the prospective buyer's conventional, gas-powered vehicle 20 need not charge batteries, a simulation could mislead the prospective purchaser. That is, an important component of simulating electric vehicles is the time and effort required to charge the batteries. Any simulation of owning an electric vehicle should be as realistic as possible. Exemplary embodiments, then, may realistically simulate electrical charging of batteries. The vehicle-side algorithm 82, for example, may cause the dashboard 24 to display a warning 230 in response to a simulated low driving range 222. The dashboard 24 may display a charging instruction 232 for the driver to proceed to the nearest charging station (as identified on the map 210 of charging stations).

As FIG. 21 illustrates, the simulation may include charge parking. When the driver's conventional, gas-powered vehicle 20 arrives at the actual location of a charging station, exemplary embodiments may simulate the time required to charge the batteries in an actual electric vehicle. The graphical interface 26 may thus include a parking instruction 240. The driver is thus instructed to park the vehicle 20, at the geographical location of the actual charging station, to simulate charging. As the vehicle 20 sits, the driver may exit and shop, just like actual drivers of electric vehicles. As the vehicle 20 sits, exemplary embodiments may virtually charge the batteries, thus simulating an actual charging cycle and experience.

FIG. 22 illustrates completion of the simulated charging cycle. When the driver returns to his conventional, gas-powered vehicle 20, the batteries have been virtually charged. Exemplary embodiments may thus cause the dashboard 24 to update the interface 26 to display an icon 242 of a fully charged virtual battery. The driver has thus experienced the time and effort required to charge real batteries in a real electric vehicle. Indeed, the driver may also have experienced the inconvenience of charging batteries.

The simulation may include environmental considerations. As the reader likely knows, temperature and electrical loading may affect the batteries. A cold ambient temperature, for example, may shorten the life of the battery. Air conditioning and heat may reduce the range of an electric vehicle. Driving behavior also affects battery life, where lead-foot accelerations may greatly consume electrical power. Exemplary embodiments may thus modify the simulation by factoring ambient temperature 244 and electrical load 246 into the simulated driving range 222.

Figure 23:
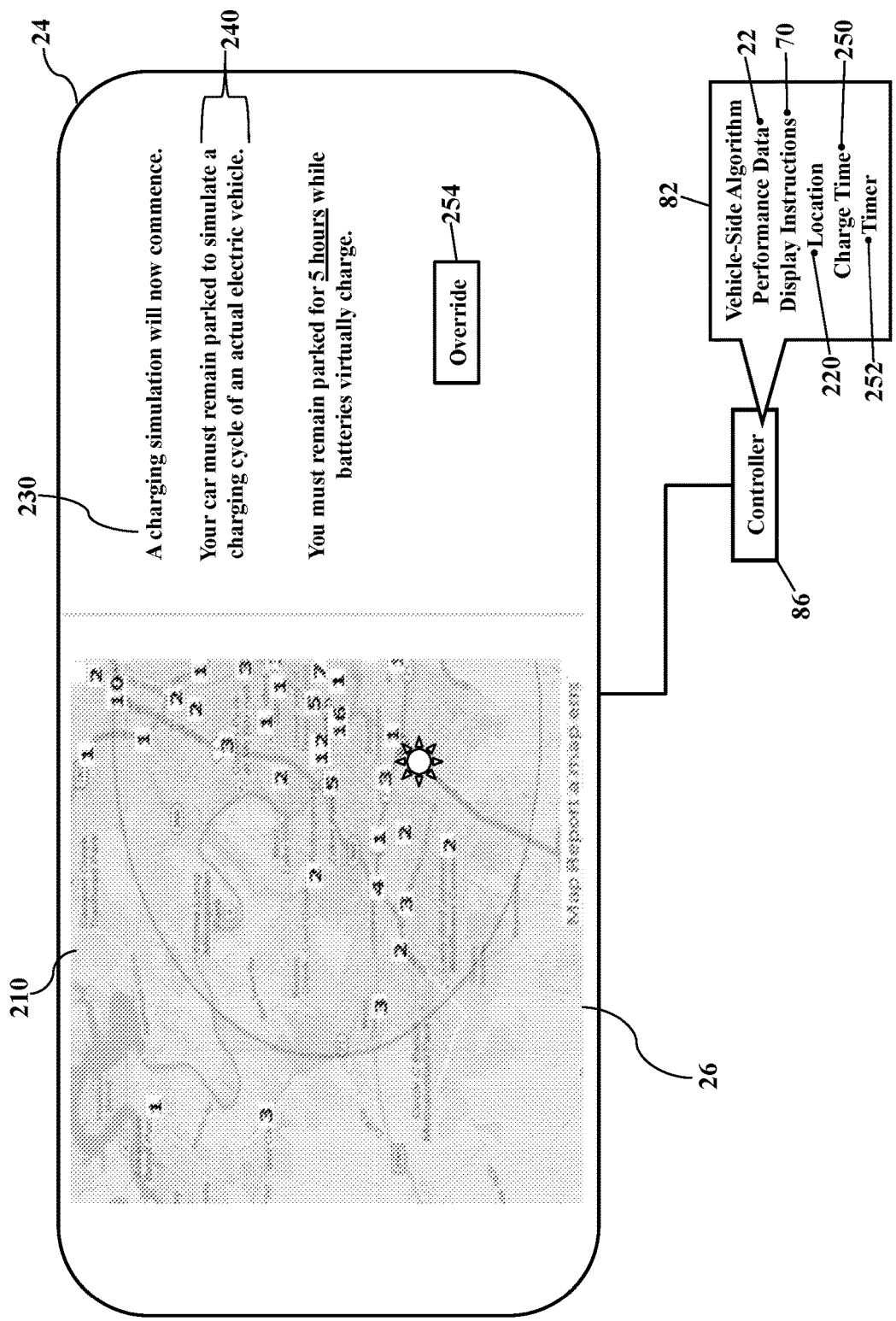
FIGS. 23-24 are diagrams illustrating more charging simulations, according to exemplary embodiments.
Figure 24:
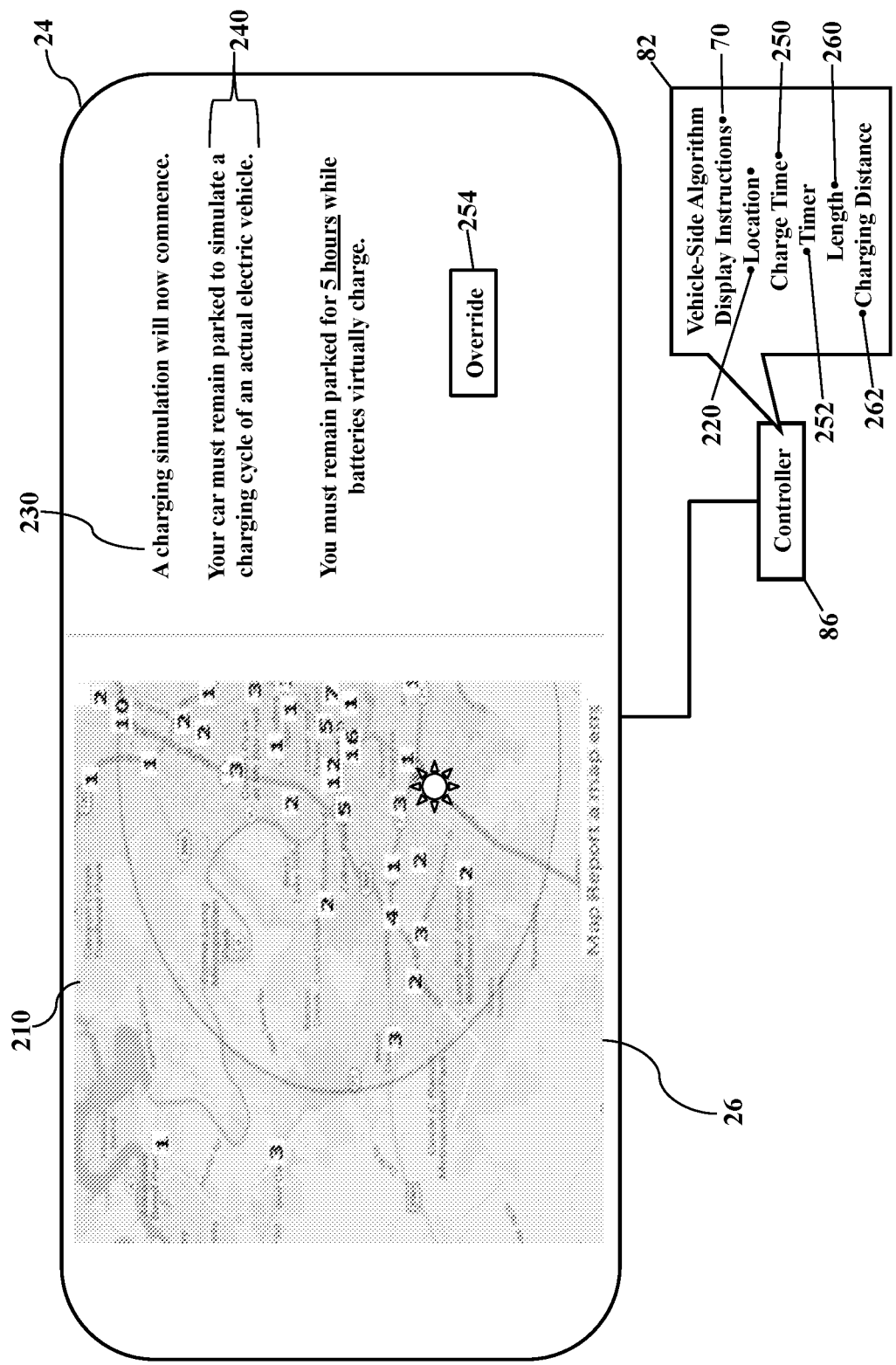

FIGS. 23-24 are diagrams illustrating more charging simulations, according to exemplary embodiments. As FIG. 23 illustrates, exemplary embodiments may force the vehicle 20 to remain parked. A realistic charging simulation is important for accurately evaluating an electric vehicle. Even though the driver may park her conventional, gas-powered vehicle 20 for a simulated charging, a realistic charging cycle may require hours of charge. Indeed, some electric vehicles require an overnight charge. Most drivers, then, will not truly park their conventional, gas-powered vehicle 20 to simulate a full charging cycle.

Exemplary embodiments, then, may force adherence. The vehicle profile 40 may thus include a parameter or data representing a charge time 250 for charging the batteries in the electric vehicle. When the driver parks her conventional, gas-powered vehicle 20 to simulate an actual charging cycle, she may be prevented from driving away. That is, exemplary embodiments may prevent further operation until the charge time 250 elapses. Exemplary embodiments may thus initialize a timer 252 that counts down from an initial value to a final value matching the simulated charge time 250. As the charge is being simulated, exemplary embodiments may ignore, block, disable, or prevent any sensor signals, controller events, or messages (perhaps along the CAN bus 140) that would allow the conventional, gas-powered vehicle 20 to drive away from the charging station. Exemplary embodiments, in other words, may force the vehicle 20 to remain stationary, at the location 220 of the charging station, until the charging simulation is complete.

An override 254 is available. The charging simulation will, no doubt, be inconvenient for some drivers. Some drivers may thus decide that an electric vehicle does not suit their needs, so the override 254 would terminate the charging simulation. Emergencies may also occur, so the driver may select the override 254 to end the charging simulation. Whatever the reason, exemplary embodiments may still allow the conventional, gas-powered vehicle 20 to continue operation, for whatever reason.

FIG. 24 illustrates a further realism for the simulated charging stop. As the reader may understand, most charging stations are only accessible by a few of the nearest parking spaces. Electric vehicles have a charging cord, so the closest few parking spaces are often reserved for electric vehicles. The vehicle profile 40, then, may include a length 260 of the charging cord for the simulated electric vehicle. When the driver approaches the location 220 of the charging station for the simulated charge, exemplary embodiments may also force the driver to park very close to the charging station. That is, the driver may be required to park her conventional, gas-powered vehicle 20 in one of the spaces nearest the charging station. Exemplary embodiments, in other words, may require that the simulation also adhere to the length 260 of the charging cord. If the driver parks her conventional, gas-powered vehicle 20 too far away from the location of the charging station, the simulation may halt. Exemplary embodiments, for example, may compare the GPS coordinates of the vehicle 20 to the GPS coordinates of the charging station (e.g., from the map 210 of charging stations). A charging distance 262 between the vehicle 20 and the charging station is determined and compared to the length 260 of the charging cord. If the charging distance 262 exceeds the length 260 of the charging cord, the charging simulation may fail. The location 220 of the charging station may thus have a radius equal to the length 260 of the charging cord. If the vehicle 20 is not parked within the radius of the charging station, the driver may be forced to choose a closer parking space.

Leeway may be permitted. Often times the closest parking spaces are reserved for electric vehicles. If the driver parks her conventional, gas-powered vehicle 20 in one of the reserved parking spaces, she may receive a municipal citation. Exemplary embodiments, then, may permit some leeway in the length 260 of the charging cord. The charging simulation may extends the length 260 of the charging cord by any added variation (such as 20-50 feet), thus allowing the vehicle 20 to park close to the charging station while still providing a realistic simulation.

Figure 25:
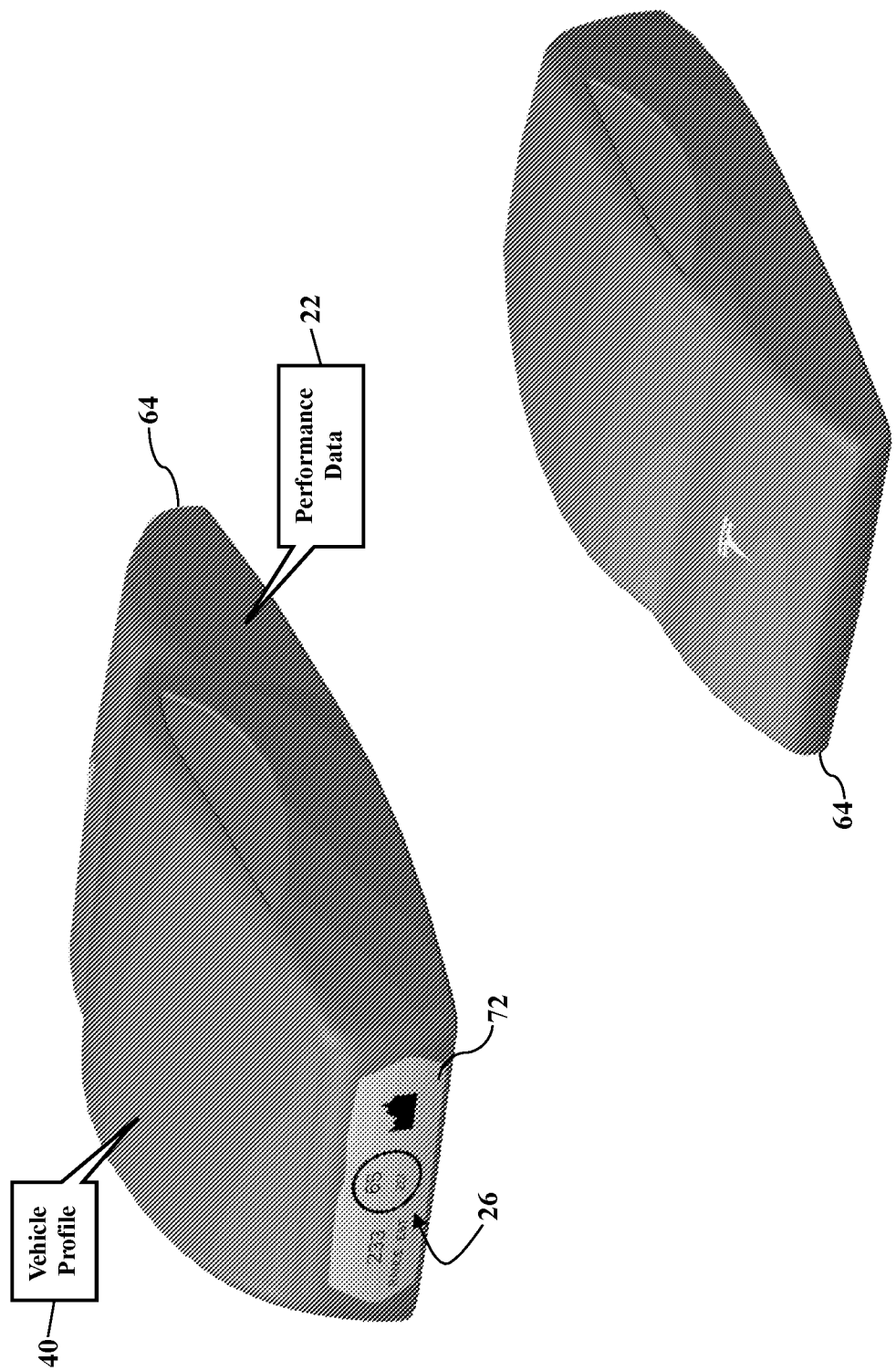
FIGS. 25-28 are diagrams illustrating a portable, mobile device, according to exemplary embodiments.

FIGS. 25-28 are diagrams further illustrating the mobile device 64, according to exemplary embodiments. Here the mobile device 64 is illustrated in different views as a portable unit for quick installation in the driver's conventional, gas-powered vehicle (described above and illustrated as reference numeral 20). In FIG. 25, the mobile device 64 interfaces with the vehicle 20 to receive the performance data 22, as earlier explained. The mobile device 64, for example, may be laid on the dash, center console, or any other location within the vehicle 20. The mobile device 64 compares the performance data 22 to the vehicle profile 40 and configures the dashboard 24 to mimic any desired vehicle, as this disclosure explains. The mobile device 64 may thus be an easy and convenient tool for automotive dealerships. When a potential customer considers the purchase of a prospective vehicle, the mobile device 64 may be quickly installed in the customer's existing vehicle 20. The mobile device 64, for example, may plug into the OBDII connector found on most vehicles. The desired vehicle profile 40 is chosen, and the mobile device 64 causes the customer's current vehicle 20 to mimic the prospective vehicle, as this disclosure further explains.

Figure 26:
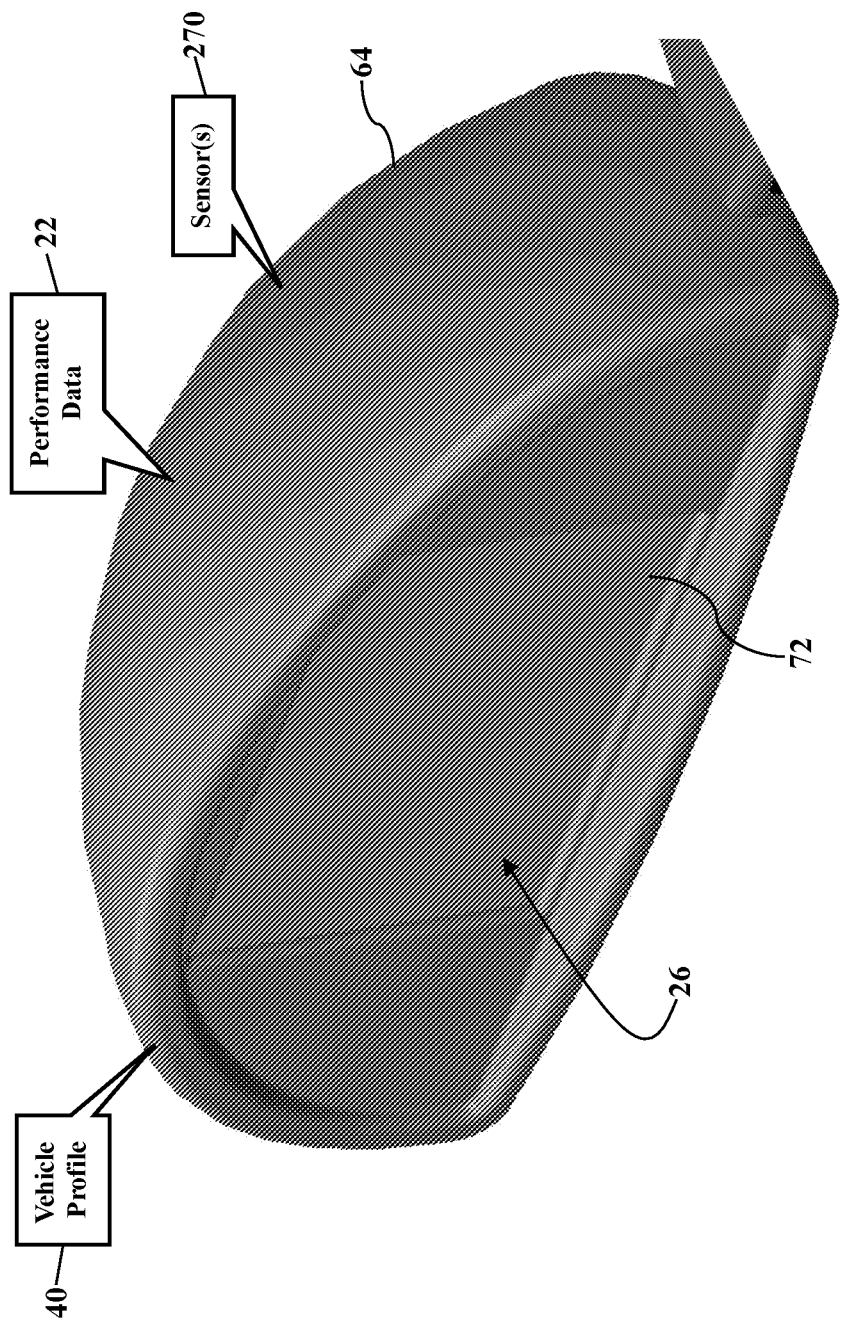
Figure 27:
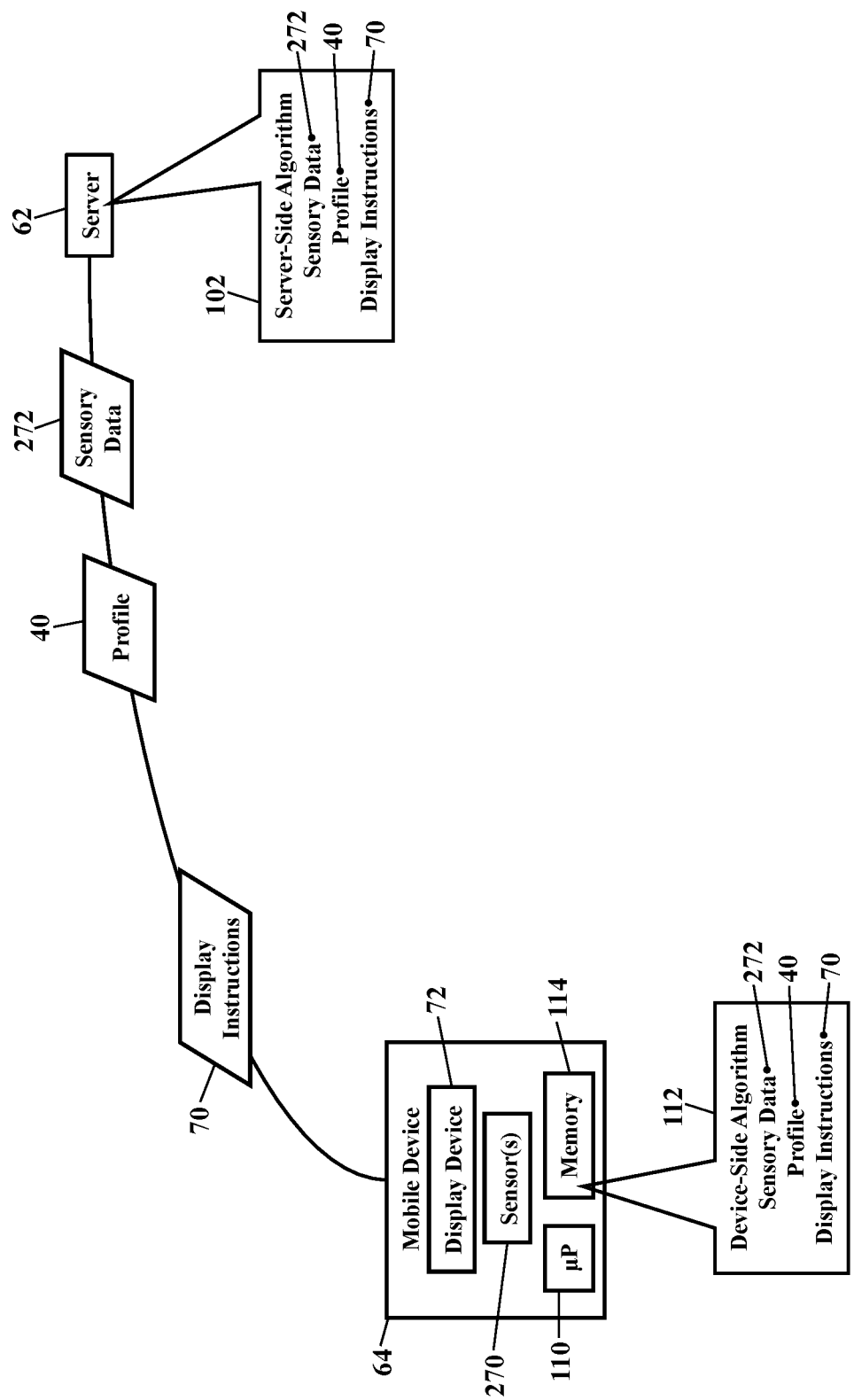
Figure 28:
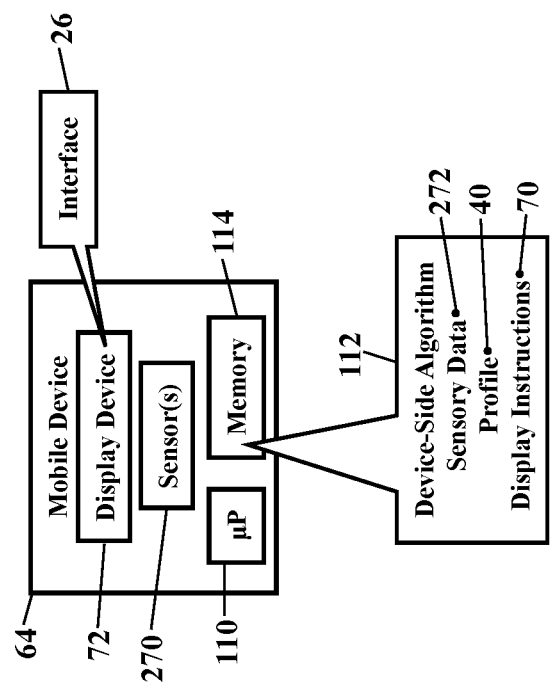

FIGS. 26-28 illustrate more autonomous solutions. Here the mobile device 64 may be stand-alone, self-contained unit with its own sensing capabilities. FIG. 26, for example, illustrates the mobile device 64 with its display device 72 for displaying the interface 26 chosen by the driver. The mobile device 64 may be laid on the dash, center console, or any other location within the vehicle 20. The mobile device 64 may have one or more of its own internal sensors 270 that acquire or estimate sensory data 272 for the vehicle profile 40. The mobile device 64 then instructs and configures its display device 72 to mimic the interface 26 of any desired vehicle, as this disclosure explains.

FIG. 27 thus illustrates a cloud-based autonomous solution. Here the mobile device 64 uses its internal sensors 270 to acquire or estimate the sensory data 272. The sensors 270, for example, may receive GPS location signals to determine or estimate the location and velocity of the vehicle. The sensors 270 may include an accelerometer to determine or estimate acceleration and deceleration at stoplights, stop signs, and intersections. A temperature sensor may provide ambient temperature data for simulating battery conditions. The sensors 270, in short, may be any sensory technology for measuring or estimating any parameter needed or desirable. The amount and capabilities of the sensors 270 need only be limited by cost and size to suit any objective. Whatever the sensory data 272, the device-side algorithm 112 may instruct the processor 110 to upload the sensory data 272 to the server 62 for analysis. The processor 110 may further upload the vehicle profile 40 chosen by the driver. The server-side algorithm 102 instructs the server 62 to generate the display instructions 70, which are return sent to the mobile device 64. The device-side algorithm 112 generates the interface 26, according to the display instructions 70. The mobile device 64 thus displays the interface 26 on its display device 72.

FIG. 28 illustrates an entirely autonomous solution. Here the mobile device 64 locally processes the sensory data 272 to generate the display instructions 70. The device-side algorithm 112 may instruct the processor 110 to acquire or read the sensory data 272 for analysis. The device-side algorithm 112 instructs the processor 110 to generate the display instructions 70, which are executed to display the interface 26 on its display device 72.

Exemplary embodiments thus simulate any vehicle a driver desires. Drivers may change their dashboard 24 to mimic any vehicle of their choice. Drivers may thus virtually, inexpensively, and quickly test-drive any vehicle. Even electric vehicles may be simulated, thus helping drivers determine if an electric vehicle suits their needs. The performance data 22 may be collected in real time or in near real time. The performance data 22 may be collected as the vehicle 20 is driven, or the performance data 22 may be downloaded at the end of any drive. The performance data 22 may be collected for any amount of time, but longer periods of time may yield more information for determining the cost 52 of ownership. Whatever performance data 22 is collected, exemplary embodiments may provide the performance data 22 to the driver, such as by SMS text message, email, or website. Exemplary embodiments thus provide a real time simulated driving experience for any vehicle of choice.

The mobile device 64 may thus be an easy sales tool for automotive dealerships. When a potential customer considers the purchase of a prospective vehicle, the mobile device 64 may be simply laid in the customer's existing vehicle 20. The desired vehicle profile 40 is chosen, and the mobile device 64 uses its internal sensors 270 to acquire the sensory data 272. Whether the sensory data 272 is remotely processed (as explained with reference to FIG. 27) or locally processed (as FIG. 28 illustrated), the display device 72 mimics the interface 26 of the prospective vehicle, as this disclosure further explains.

Dealers, however, may limit the selection of vehicles. As the reader may understand, automotive dealerships may be reluctant to mimic the interface 26 of a competitive vehicle. A TOYOTA® dealer, for example, may not want its potential PRIUS® customers selecting the interface 26 of the TESLA MOTORS® MODEL S®. Exemplary embodiments, then, may be configured to limit the selection of vehicles in the menu of vehicles (as explained with reference to FIGS. 2 & 13-17). That is, an administrator may exclude some vehicles from the menu of vehicles to prohibit their selection and use. Exemplary embodiments may thus be configured to avoid soliciting competitive vehicles.

The mobile device 64 may also be an aftermarket offering. Because the mobile device 64 may be an autonomous solution, exemplary embodiments are an easy, do-it-yourself addition to any vehicle. The mobile device 26, as earlier paragraphs explained, may plug into and interface with the vehicle's OBDII system, thus allowing the mobile device 64 to acquire the performance data 22 generated by the vehicle 10. The mobile device 64, however, may also be purchased with its internal sensors 270 to generate its own sensory data 272. The sensory data 272 may be locally or remotely processed (as earlier explained), and the mobile device 64 displays the selected interface 26.

Exemplary embodiments are especially helpful for efficiency training. Many drivers practice inefficient driving habits, thus wasting expensive gasoline. Indeed, many new owners of electric vehicles complain about lower-than-expected driving ranges in electric-only mode, which is primarily due to their poor driving habits. Efficient driving habits require a change in mindset and, especially, a light foot. Exemplary embodiments, then, not only provide the graphical interface 26 of an electric vehicle, but the interface 26 may further simulate efficiency indicators. So, prior to purchasing an efficient vehicle, potential buyers may begin adjusting their driving habits to adopt efficient practices. Exemplary embodiments thus train drivers to adopt efficient driving styles, whether they drive a gasoline or electric vehicle.

Figure 29:
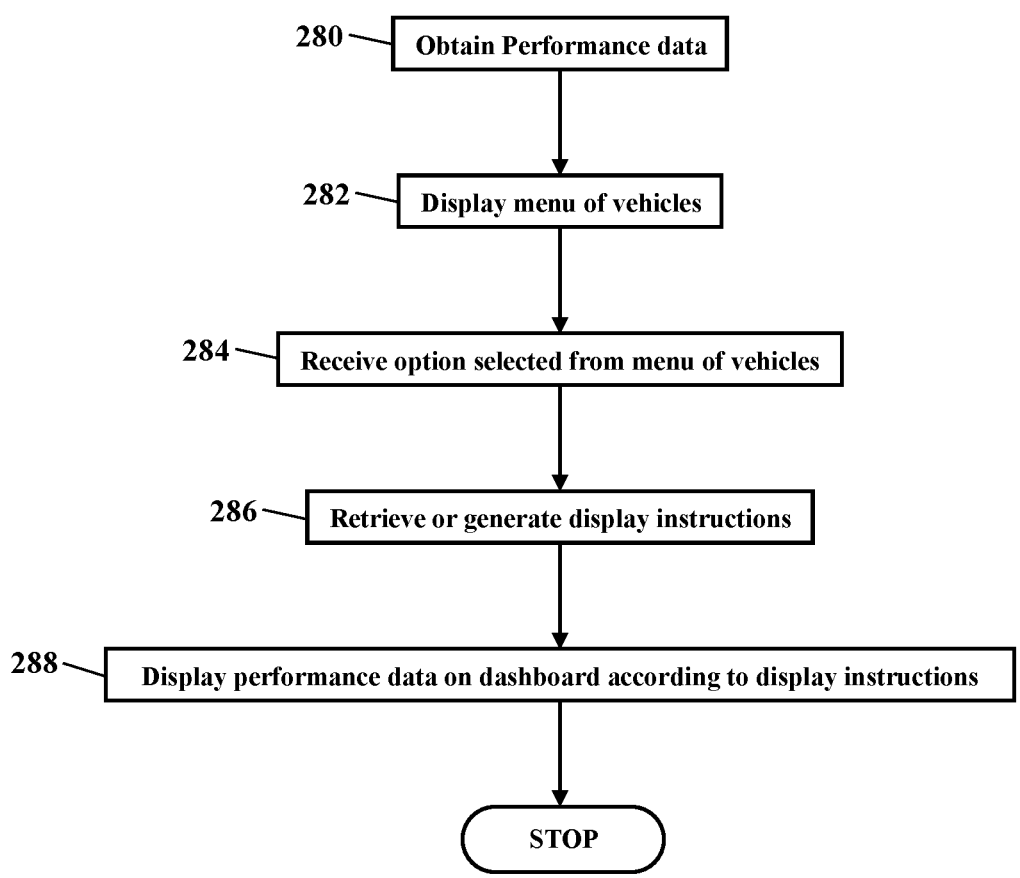
FIG. 29 is a diagram illustrating a method of simulation, according to exemplary embodiments.

FIG. 29 is a diagram illustrating a method of simulation, according to exemplary embodiments. The performance data 22 is obtained (Block 280). The graphical menu 30 of vehicles is displayed by the dashboard 24, thus presenting options for selecting different vehicles for different simulations (Block 282). The option 36 from the menu 30 of vehicles is received (Block 284). The vehicle profile 40 is retrieved (Block 286). The display instructions 70 are retrieved for displaying the performance data 22 using the graphical interface 26 from the vehicle profile 40 (Block 288). The performance data 22 is displayed on the dashboard 24 according to the display instructions 70 (Block 290).

Figure 30:
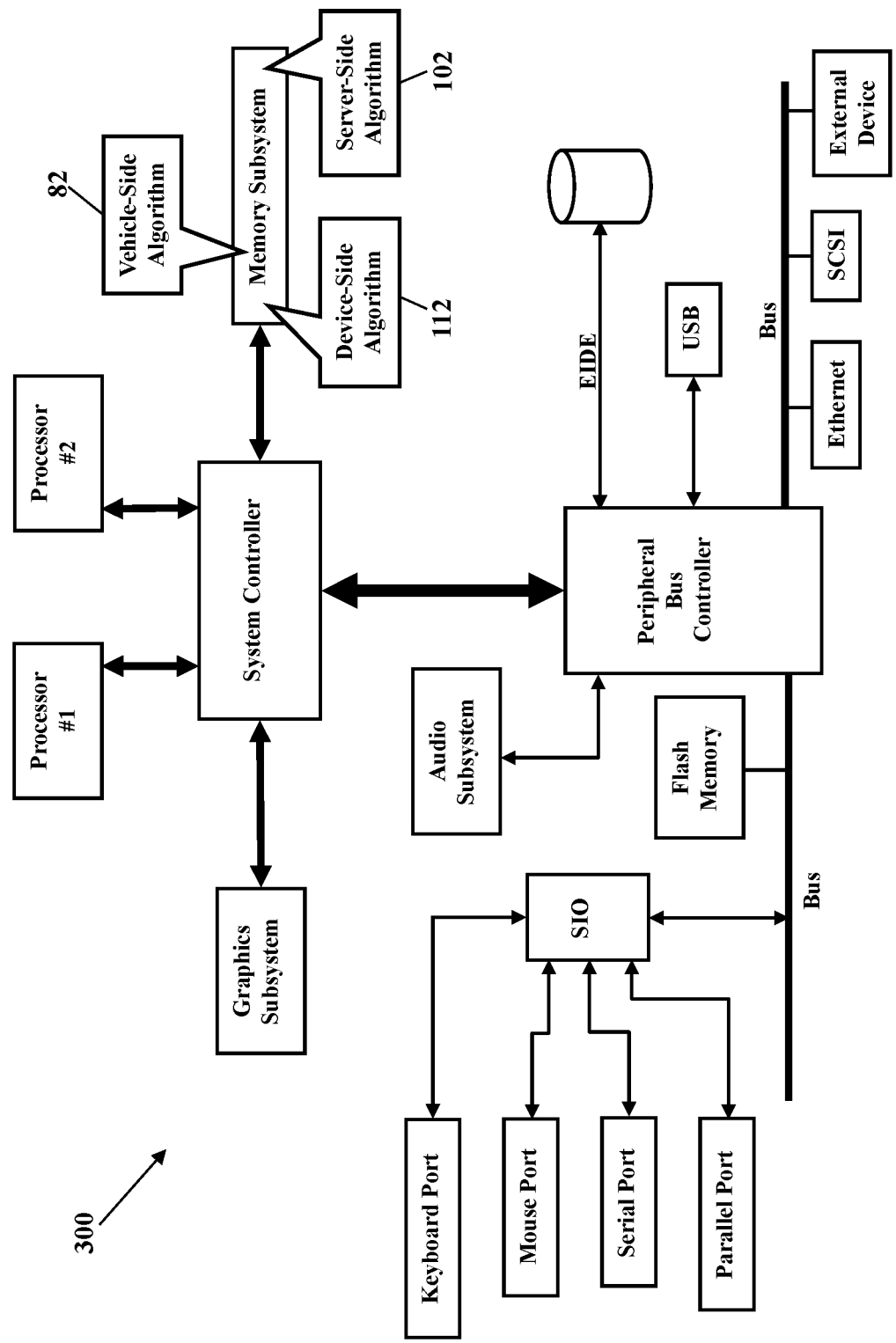
FIGS. 30-31 depict still more operating environments for additional aspects of the exemplary embodiments.

FIG. 30 is a schematic illustrating still more exemplary embodiments. FIG. 30 is a more detailed diagram illustrating a processor-controlled device 300. As earlier paragraphs explained, the vehicle-side algorithm 22, the server-side algorithm 102, and/or the device-side algorithm 112 may operate in any processor-controlled device. FIG. 30, then, illustrates the vehicle-side algorithm 22, the server-side algorithm 102, and/or the device-side algorithm 112 stored in a memory subsystem of the processor-controlled device 300. One or more processors communicate with the memory subsystem and execute either, some, or all applications. Because the processor-controlled device 300 is well known to those of ordinary skill in the art, no further explanation is needed.

Figure 31:
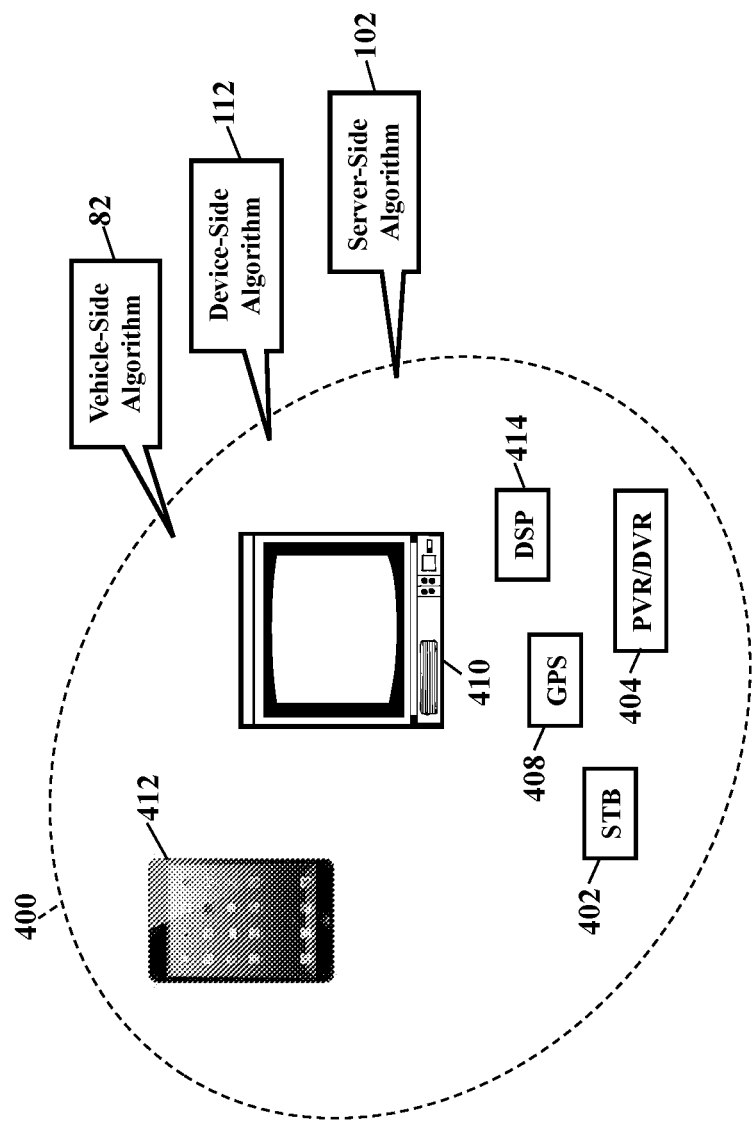

FIG. 31 depicts other possible operating environments for additional aspects of the exemplary embodiments. FIG. 31 illustrates the vehicle-side algorithm 22, the server-side algorithm 102, and/or the device-side algorithm 112 operating within various other devices 400. FIG. 31, for example, illustrates that the vehicle-side algorithm 22, the server-side algorithm 102, and/or the device-side algorithm 112 may entirely or partially operate within a set-top box ("STB") (402), a personal/digital video recorder (PVR/DVR) 404, a Global Positioning System (GPS) device 408, an interactive television 410, a tablet computer 412, or any computer system, communications device, or processor-controlled device utilizing the processor 50 and/or a digital signal processor (DP/DSP) 414. The device 400 may also include kiosks, hand-held service units, watches, radios, clocks, printers, gateways, mobile/implantable medical devices, and other apparatuses and systems. Because the architecture and operating principles of the various devices 400 are well known, the hardware and software componentry of the various devices 400 are not further shown and described.

Exemplary embodiments may be physically embodied on or in a computer-readable storage medium. This computer-readable medium, for example, may include CD-ROM, DVD, tape, cassette, floppy disk, optical disk, memory card, memory drive, and large-capacity disks. This computer-readable medium, or media, could be distributed to end-subscribers, licensees, and assignees. A computer program product comprises processor-executable instructions for simulating vehicles, as the above paragraphs explained.

While the exemplary embodiments have been described with respect to various features, aspects, and embodiments, those skilled and unskilled in the art will recognize the exemplary embodiments are not so limited. Other variations, modifications, and alternative embodiments may be made without departing from the spirit and scope of the exemplary embodiments.

The invention claimed is:

1. A method, comprising:
   receiving, by an engine electronic control unit comprising a processor, performance data generated by a sensor monitoring an internal combustion engine operating in a vehicle;
   retrieving, by the engine electronic control unit, an electronic dashboard associated with an electric vehicle, the electronic dashboard describing a charging cycle applicable to charging a battery in the electric vehicle;
   replacing, by the engine electronic control unit, an original equipment manufacturer dashboard with the electronic dashboard associated with the electric vehicle;
   generating, by the engine electronic control unit, a simulation of the charging cycle in the electronic dashboard for a charge time associated with the electric vehicle; and
   causing, by the engine electronic control unit, the vehicle to remain stationary during the charge time by blocking a controller event;
   wherein the engine electronic control unit simulates in the electronic dashboard the charging cycle associated with the electric vehicle.

2. The method of claim 1, further comprising ceasing, by the engine electronic control unit, an operation of the internal combustion engine to simulate the charging cycle.

3. The method of claim 1, further comprising displaying, by the engine electronic control unit via the electronic dashboard, a menu of electric vehicles.

4. The method of claim 3, further comprising receiving, by the engine electronic control unit, a selection of the electric vehicle displayed by the electronic dashboard.

5. The method of claim 1, further comprising receiving, by the engine electronic control unit, a selection specifying the electric vehicle.

6. The method of claim 1, further comprising mapping, by the engine electronic control unit, a location associated with a charging station.

7. The method of claim 1, further comprising virtually charging, by the engine control unit, the vehicle as part of the simulation of the charging cycle associated with the electric vehicle.

8. A system, comprising:
   a processor; and
   a memory that stores executable instructions that, when executed by the processor, facilitate performance of operations by an engine electronic control unit, comprising:
   receiving performance data from a sensor that monitors an internal combustion engine operating in a vehicle;
   retrieving an electronic dashboard associated with an electric vehicle;
   retrieving a charge time from a profile associated with the electric vehicle;
   replacing an original equipment manufacturer dashboard with the electronic dashboard associated with the electric vehicle;
   generating a simulation of a charging cycle for the charge time associated with the electric vehicle; and
   forcing the vehicle to remain stationary for the charge time by blocking an event generated by the engine electronic control unit;
   wherein the vehicle simulates the charging cycle associated with the electric vehicle according to the simulation.

9. The system of claim 8, wherein the operations further comprise ceasing an operation of the internal combustion engine during the simulation of the charging cycle.

10. The system of claim 8, wherein the operations further comprise displaying a menu of electric vehicles.

11. The system of claim 10, wherein the operations further comprise receiving a selection of the electric vehicle displayed in the menu of electric vehicles.

12. The system of claim 8, wherein the operations further comprise receiving a selection specifying the electric vehicle.

13. The system of claim 8, wherein the operations further comprise mapping a location associated with a charging station.

14. The system of claim 8, wherein the operations further comprise virtually charging a battery as at least part of the simulation of the charging cycle associated with the electric vehicle.

15. A non-transitory machine-readable medium, comprising executable instructions that, when executed by a processor of an engine electronic control unit, facilitate performance of operations, comprising:
   collecting performance data received from a sensor, the sensor monitoring an internal combustion engine operating in a vehicle;
   retrieving an electronic dashboard associated with an electric vehicle;
   retrieving a charge time associated with the electric vehicle;
   replacing an original equipment manufacturer dashboard with the electronic dashboard associated with the electric vehicle;
   generating a simulation of a charging cycle for the charge time associated with the electric vehicle; and
   forcing the vehicle to remain stationary for the charge time by ignoring an event generated by the engine electronic control unit,
   wherein the vehicle performs the simulation of the charging cycle associated with the electric vehicle.

16. The non-transitory machine-readable medium of claim 15, wherein the operations further comprise ceasing an operation of the internal combustion engine during the simulation of the charging cycle.

17. The non-transitory machine-readable medium of claim 15, wherein the operations further comprise displaying a menu of electric vehicles.

18. The non-transitory machine-readable medium of claim 17, wherein the operations further comprise receiving a selection of the electric vehicle displayed in the menu of electric vehicles.

19. The non-transitory machine-readable medium of claim 15, wherein the operations further comprise receiving a selection specifying the electric vehicle.

20. The non-transitory machine-readable medium of claim 15, wherein the operations further comprise virtually charging a battery as the simulation of the charging cycle associated with the electric vehicle.

\* \* \* \* \*